US010204983B2

(12) United States Patent
Suk et al.

(10) Patent No.: US 10,204,983 B2
(45) Date of Patent: Feb. 12, 2019

(54) SEMICONDUCTOR DEVICE AND METHOD FOR FABRICATING THE SAME

(71) Applicant: Samsung Electronics Co., Ltd., Suwon-si (KR)

(72) Inventors: Sung Dae Suk, Seoul (KR); Seung Min Song, Yongin-si (KR); Geum Jong Bae, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 12 days.

(21) Appl. No.: 15/444,550

(22) Filed: Feb. 28, 2017

(65) Prior Publication Data
US 2017/0256608 A1 Sep. 7, 2017

(30) Foreign Application Priority Data

Mar. 2, 2016 (KR) ........................ 10-2016-0025047

(51) Int. Cl.
*H01L 29/06* (2006.01)
*H01L 29/423* (2006.01)
(Continued)

(52) U.S. Cl.
CPC .... *H01L 29/0653* (2013.01); *H01L 29/42392* (2013.01); *H01L 29/4983* (2013.01); *H01L 29/513* (2013.01); *H01L 29/6656* (2013.01); *H01L 29/66439* (2013.01); *H01L 29/66553* (2013.01); *H01L 29/66742* (2013.01); *H01L 29/775* (2013.01); *H01L 29/786* (2013.01);
(Continued)

(58) Field of Classification Search
USPC ........................................................ 257/29
See application file for complete search history.

(56) References Cited

U.S. PATENT DOCUMENTS 7,253,060 B2   8/2007   Yun et al.
7,374,986 B2   5/2008   Kim et al.
(Continued)

FOREIGN PATENT DOCUMENTS

KR   2007-0068736   7/2007

*Primary Examiner* — Moazzam Hossain
*Assistant Examiner* — Lawrence C Tynes, Jr.
(74) *Attorney, Agent, or Firm* — Muir Patent Law, PLLC

(57) ABSTRACT

A semiconductor device may include a substrate, a first nanowire, a gate electrode, a first gate spacer, a second gate spacer, a source/drain and a spacer connector. The first nanowire may be extended in a first direction and spaced apart from the substrate. The gate electrode may surround a periphery of the first nanowire, and extend in a second direction intersecting the first direction, and include first and second sidewalls opposite to each other. The first gate spacer may be formed on the first sidewall of the gate electrode. The first nanowire may pass through the first gate spacer. The second gate spacer may be formed on the second sidewall of the gate electrode. The first nanowire may pass through the second gate spacer. The source/drain may be disposed on at least one side of the gate electrode and connected with the first nanowire. The spacer connector may be disposed between the first nanowire and the substrate. The spacer connector may connect the first gate spacer and the second gate spacer to each other.

19 Claims, 35 Drawing Sheets

(51) Int. Cl.
    *H01L 29/49*     (2006.01)
    *H01L 29/51*     (2006.01)
    *H01L 29/66*     (2006.01)
    *H01L 29/78*     (2006.01)
    *H01L 29/786*     (2006.01)
    *H01L 29/775*     (2006.01)

(52) U.S. Cl.
    CPC ...... *H01L 29/7853* (2013.01); *H01L 29/0673* (2013.01)

(56) References Cited

U.S. PATENT DOCUMENTS

| | | |
|---|---|---|
| 8,110,471 B2 | 2/2012 | Lee et al. |
| 8,373,223 B2 | 2/2013 | Choi |
| 8,492,232 B2 | 7/2013 | Ernst et al. |
| 8,994,081 B2 | 3/2015 | Leobandung |
| 2014/0151639 A1 | 6/2014 | Chang et al. |
| 2015/0084041 A1 | 3/2015 | Hur et al. |
| 2015/0090958 A1 | 4/2015 | Yang et al. |
| 2015/0333162 A1 | 11/2015 | Bouche et al. |
| 2017/0069763 A1* | 3/2017 | Doris ................. H01L 21/0228 |
| 2017/0117375 A1* | 4/2017 | Kim ................. H01L 29/42392 |

* cited by examiner

FIG. 33
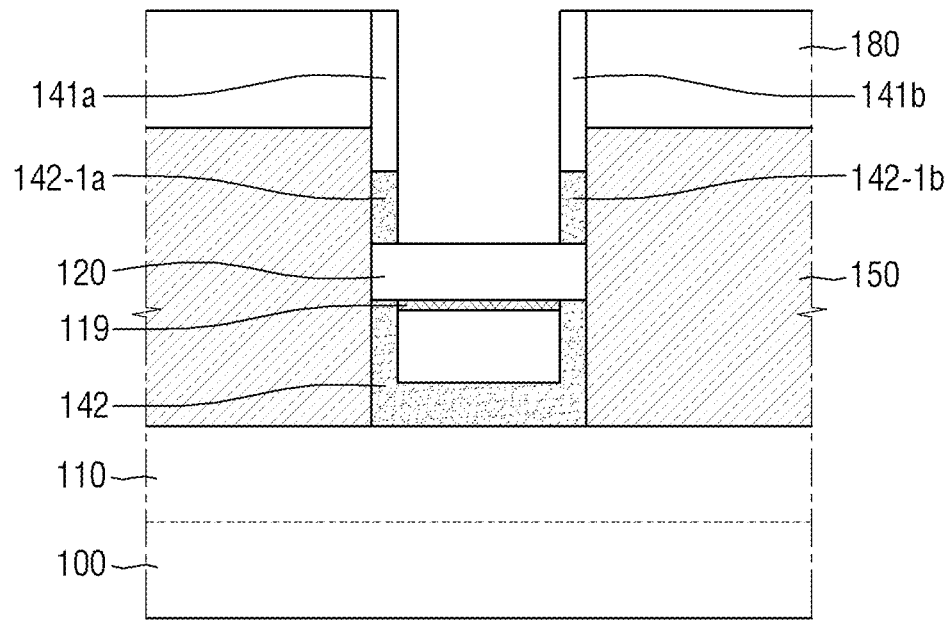
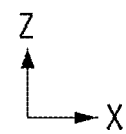
FIG. 34
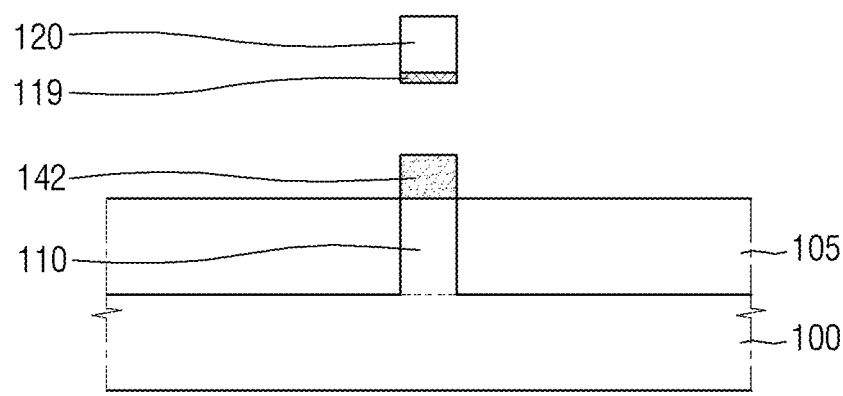
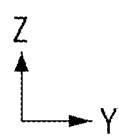

FIG. 35
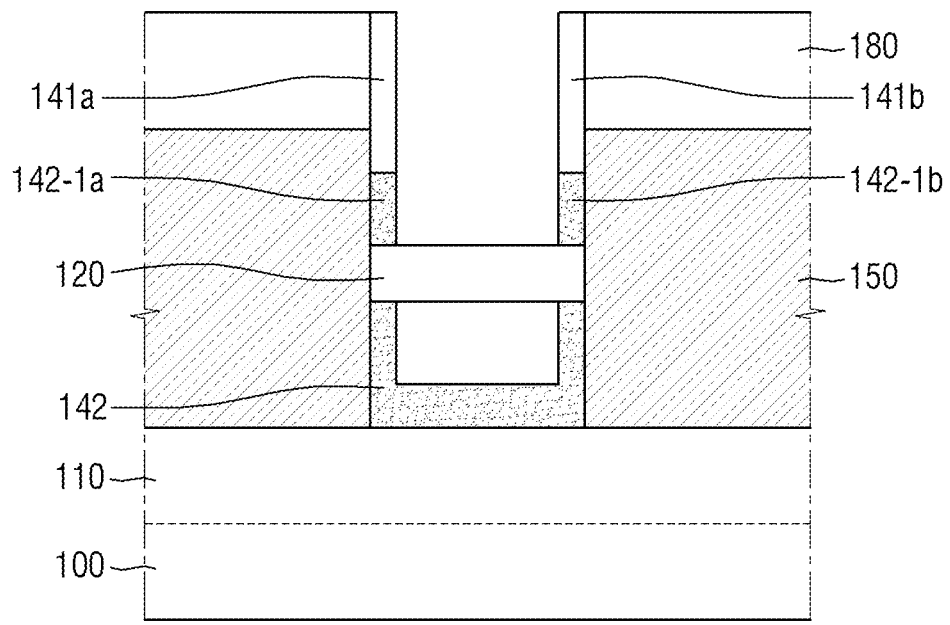
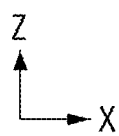
FIG. 36
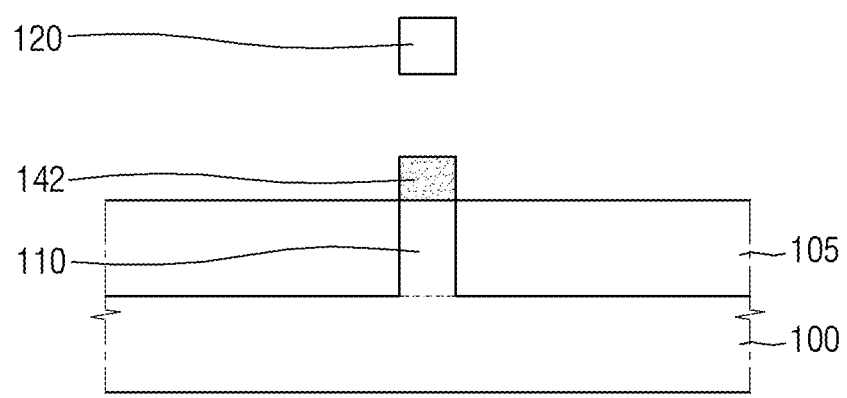
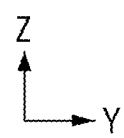

1300

SEMICONDUCTOR DEVICE AND METHOD FOR FABRICATING THE SAME

CROSS-REFERENCE TO RELATED APPLICATION

This U.S. non-provisional patent application claims priority under 35 U.S.C. § 119 to Korean Patent Application No. 10-2016-0025047, filed on Mar. 2, 2016, the contents of which are hereby incorporated herein by reference in their entirety.

FIELD

The example embodiments of the inventive concepts generally relate to a semiconductor device and a method of fabricating the same.

BACKGROUND

Multi-gate transistors have been suggested to integrate more transistors without degrading performances thereof. Some multi-gate transistors include three-dimensional channels. Current control capability of multi-gate transistors may be increased without increasing gate lengths thereof. Further, short channel effect (SCE) may be suppressed.

SUMMARY

One embodiment of the inventive concept provides a semiconductor device with improved operating characteristics.

Another embodiment of the inventive concept provides a method of fabricating a semiconductor device with improved operating characteristics.

According to example embodiments of the inventive concept, a semiconductor device may include a substrate, a first nanowire, a gate electrode, a first gate spacer, a second gate spacer, a source/drain and a spacer connector. The first nanowire may be extended in a first direction and spaced apart from the substrate. The gate electrode may surround a periphery of the first nanowire, and may extend in a second direction intersecting the first direction, and may include first and second sidewalls opposite to each other. The first gate spacer may be formed on the first sidewall of the gate electrode. The first nanowire may pass through the first gate spacer. The second gate spacer may be formed on the second sidewall of the gate electrode. The first nanowire may pass through the second gate spacer. The source/drain may be disposed on at least one side of the gate electrode and connected with the first nanowire. The spacer connector may be disposed between the first nanowire and the substrate. The spacer connector may connect the first gate spacer and the second gate spacer to each other.

According to example embodiments of the inventive concept, a semiconductor device may include a substrate, a first nanowire, a gate electrode, a gate spacer, a source/drain and an inner spacer. The first nanowire may be extended in a first direction and spaced apart from the substrate. The gate electrode may surround a periphery of the first nanowire, and may extend in a second direction intersecting the first direction. A gate spacer may be disposed on a sidewall of the gate electrode. The gate spacer may include inner and outer sidewalls opposite to each other, and the inner sidewall of the gate spacer faces the gate electrode. A source/drain may be disposed on at least one side of the gate electrode and connected with the first nanowire. The first nanowire may pass through the gate spacer to be connected to the source/drain. An inner spacer may include a protruding portion disposed between the substrate and the first nanowire and contacting a lower surface of the first nanowire, and a spaced portion connected to the protruding portion and spaced apart from the lower surface of the first nanowire.

According to example embodiments of the inventive concept, a method of fabricating a semiconductor device may include forming a fin-type structure extending in a first direction on a substrate and having a first semiconductor pattern, a second semiconductor pattern and a third semiconductor pattern, the second and third semiconductor patterns being alternatively stacked on the first semiconductor pattern, forming a dummy gate electrode on the fin-type structure, the dummy gate electrode intersecting the fin-type structure and extending in a second direction different from the first direction, forming a first spacer on the sidewall of the dummy gate electrode, removing a portion of the fin-type structure which is not overlapped with the dummy gate electrode and the first spacer to form a recess within the fin-type structure, removing at least a portion of the second semiconductor pattern which is exposed by the recess and overlapped with the first spacer to form a dimple, completely removing the first semiconductor pattern exposed by the recess to form a through hole, forming an inner spacer layer filling the dimple and the through hole, removing a portion of the inner spacer layer to form an upper inner spacer in the dimple and a lower inner spacer in the through hole, and forming a source/drain filling the recess.

According to example embodiments of the inventive concept, a semiconductor device, may include: a substrate; a first nanowire extended in a first direction and spaced apart from the substrate; a gate electrode surrounding a periphery of the first nanowire and extending in a second direction intersecting the first direction; a gate spacer disposed on a sidewall of the gate electrode, wherein the gate spacer comprises inner and outer sidewalls opposite to each other, and the inner sidewall of the gate spacer faces the gate electrode; a source/drain disposed on at least one side of the gate electrode and connected with the first nanowire, wherein the first nanowire passes through the gate spacer to be connected to the source/drain; and an inner spacer disposed between the substrate and the first nanowire, wherein a material included in the gate spacer has a first dielectric constant and a material included in the inner spacer has a second dielectric constant different from the first dielectric constant.

BRIEF DESCRIPTION OF THE DRAWINGS

Some embodiments will be more clearly understood from the following brief description taken in conjunction with the accompanying drawings. The accompanying drawings represent non-limiting example embodiments as described herein.

FIGS. 19 to 36 are drawings illustrating a method for fabricating a semiconductor device according to example embodiments of the inventive concept.

Figure 1:
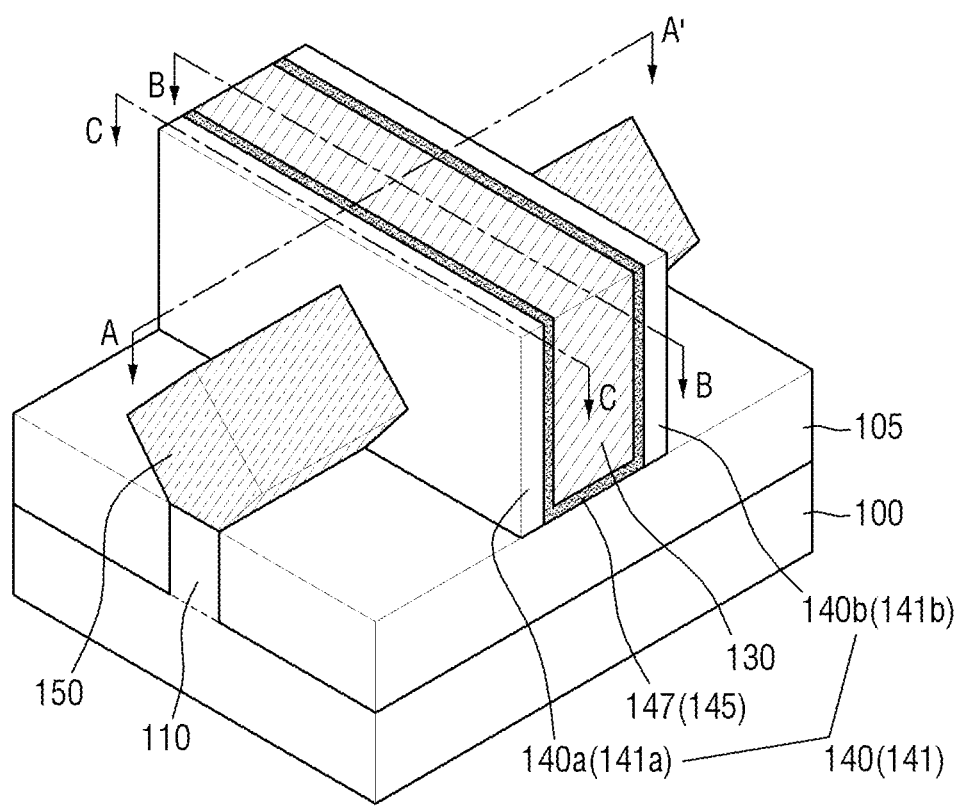
FIG. 1 is a perspective view illustrating a semiconductor device according to some example embodiments of the inventive concept.

It should be noted that these figures are intended to illustrate the general characteristics of methods, structures and/or materials utilized in certain some embodiments and to supplement the written description provided below. These drawings may not, however, be to scale and may not precisely reflect the precise structural or performance characteristics of any given embodiment, and should not be interpreted as limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). The term "contact" or "in contact with" as used herein refers to a direct connection (e.g., touching).

It will be understood that, although the terms "first", "second", etc, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Some embodiments of the inventive concepts are described herein with reference to cross-sectional illustrations that are schematic illustrations of idealized embodiments (and intermediate structures) of some embodiments. As such, variations from the shapes of the illustrations as a result, for example, of manufacturing techniques and/or tolerances, are to be expected. Thus, some embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of some embodiments.

Hereinafter, a semiconductor device according to some example embodiments of the inventive concept will be explained with reference to FIGS. 1 to 6.

Figure 2:
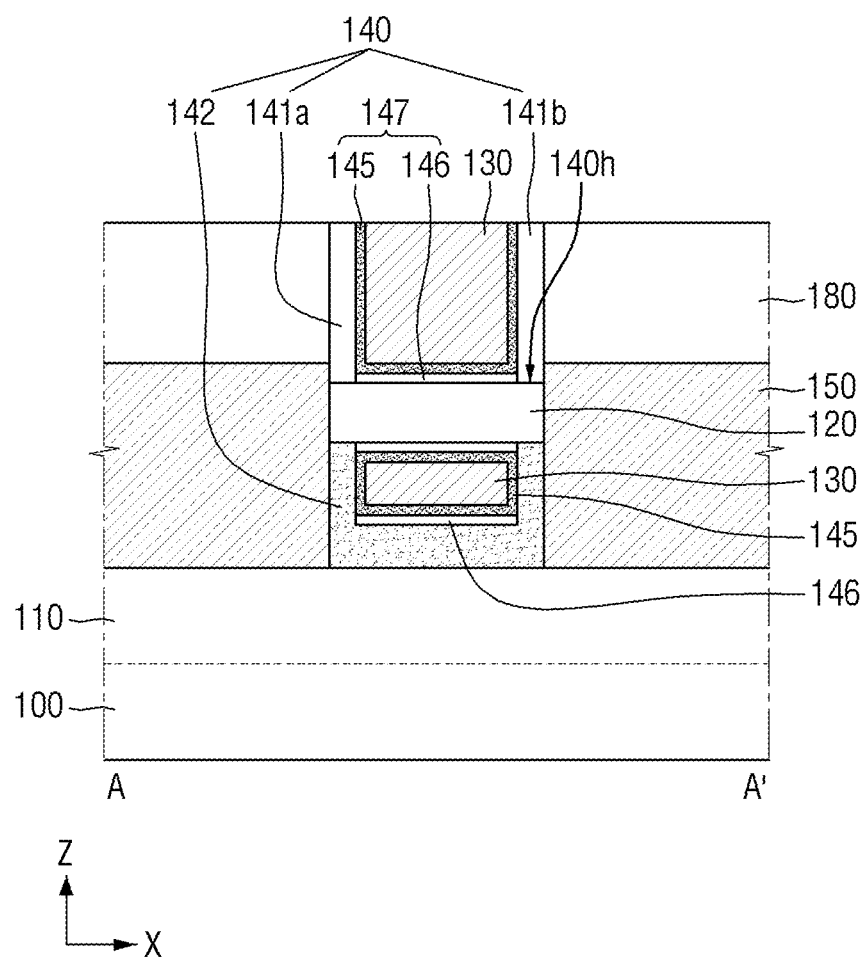
FIG. 2 is a cross-sectional view taken along line A-A' of FIG. 1.
Figure 3:
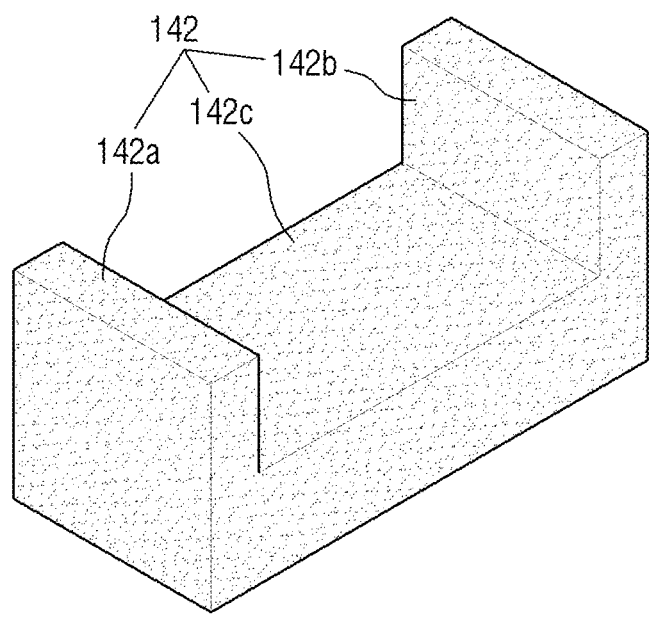
FIG. 3 is a perspective view illustrating an inner spacer of FIG. 2 in detail.
Figure 4:
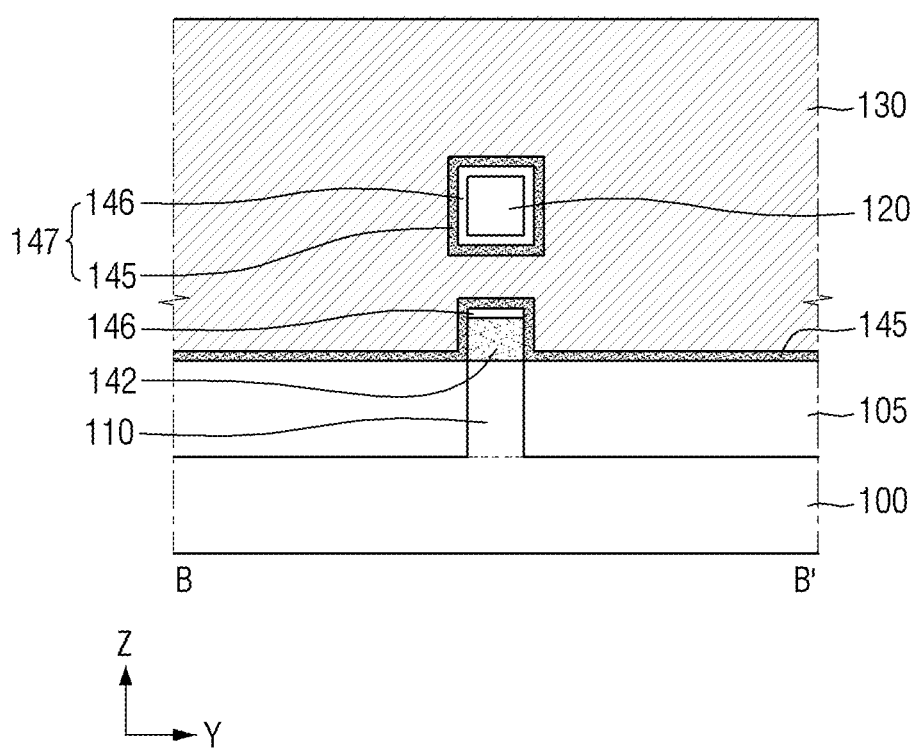
FIG. 4 is a cross-sectional view taken along line B-B' of FIG. 1.
Figure 5:
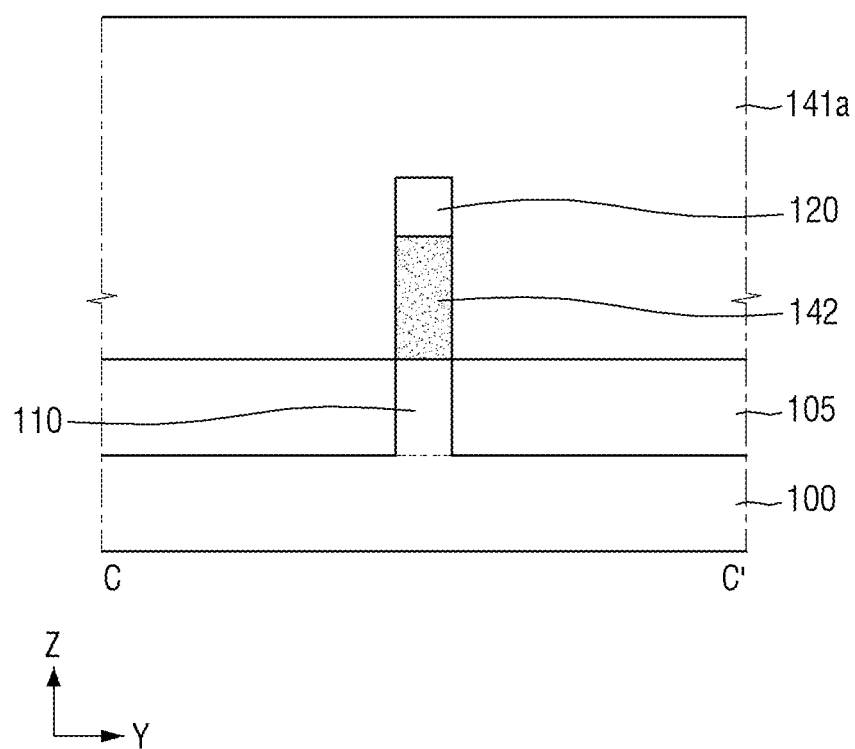
FIG. 5 is a cross-sectional view taken along line C-C' of FIG. 1.
Figure 6:
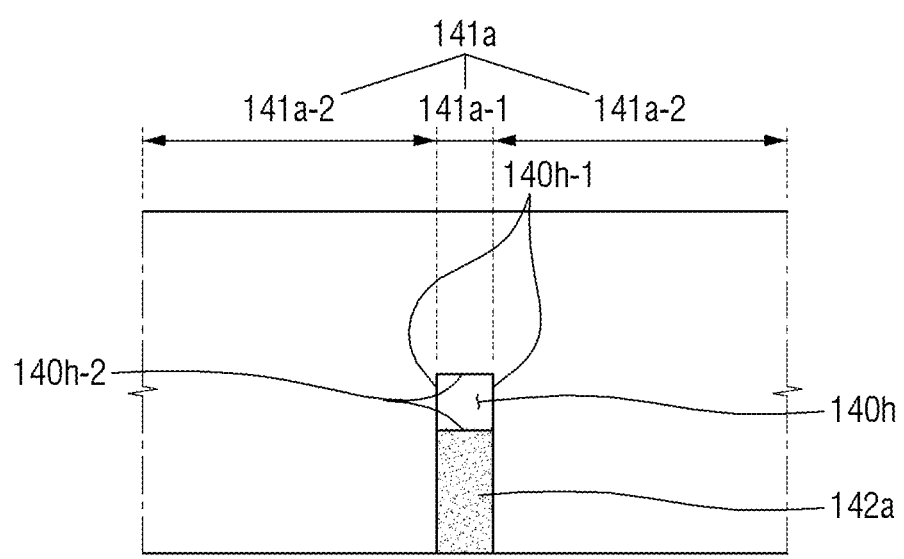
FIG. 6 is a cross-sectional view illustrating an outer spacer and an inner spacer of FIG. 5 in detail.

FIG. 1 is a perspective view illustrating a semiconductor device according to some example embodiments of the inventive concept, and FIG. 2 is a cross-sectional view taken along line A-A' of FIG. 1. FIG. 3 is a perspective view illustrating an inner spacer of FIG. 2 in detail, and FIG. 4 is a cross-sectional view taken along line B-B' of FIG. 1. FIG. 5 is a cross-sectional view taken along line C-C' of FIG. 1, and FIG. 6 is a cross-sectional view illustrating an outer spacer and an inner spacer of FIG. 5 in detail.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIGS. 1 and 2, a semiconductor device may include a fin-type pattern 110, a first nanowire 120, a gate electrode 130, a gate spacer 140 and a source/drain 150.

A substrate 100 may include, for example, bulk silicon or silicon-on-insulator (SOI). Alternatively, the substrate 100 may be a silicon substrate, or may include other substances such as silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The substrate 100 may be formed with a protrusion that forms the fin-type pattern 110. For example, the fin-type pattern 110 may protrude from a surface of the substrate 100. A field insulating layer 105 may at least partially cover a sidewall of the fin-type pattern 110. The fin-type pattern 110 may be defined by the field insulating layer 105. The field insulating layer 105 may include, for example, at least one of an oxide layer, a nitride layer, an oxynitride layer or a combination thereof.

Although the sidewall of the fin-type pattern 110 may be completely covered by the field insulating layer 105 as shown in FIG. 1, this is only for illustrative purpose, and it is not limited thereto. In some embodiments, the sidewall of the fin-type pattern 110 may be partially covered by the field insulating layer 105.

The fin-type pattern 110 may extend in a first direction X. For example, the fin-type pattern 110 may include a longer side extending in the first direction X, and a shorter side extending in a second direction Y.

The fin-type pattern 110 may be formed by partially etching the substrate 100. Alternatively, first fin-type pattern 110 may include an epitaxial layer grown on the substrate 100. The fin-type pattern 110 may include an element semiconductor material such as silicon or germanium. Furthermore, the fin-type pattern 110 may include a compound semiconductor such as, IV-IV group compound semiconductor or III-V group compound semiconductor.

For example, in IV-IV group compound semiconductor, the fin-type pattern 110 may be a binary compound or a ternary compound including, for example, at least two or more of carbon (C), silicon (Si), germanium (Ge), and tin (Sn), or the above-mentioned binary or ternary compound doped with IV group element.

For example, in III-V group compound semiconductor, the fin-type pattern 110 may be a binary compound, ternary compound or quaternary compound which is formed by combining at least one of aluminum (Al), gallium (Ga), and indium (In) from group III with at least one of phosphorus (P), arsenic (As), and antimony (Sb) from group V.

In the following description, it is assumed that the fin-type pattern 110 includes silicon.

The first nanowire 120 may be formed on the substrate 100, and spaced apart from the substrate 100. The first nanowire 120 may extend in the first direction X.

The first nanowire 120 may be formed on the fin-type pattern 110, and spaced apart from the fin-type pattern 110. The first nanowire 120 may be overlapped with the fin-type pattern 110. In some embodiments, the first nanowire 120 may be formed on the fin-type pattern 120, rather than being formed on the field insulating layer 105.

Although a width of the first nanowire 120 in the second direction Y may be the same as a width of the fin-type pattern 110 in the second direction Y as shown in FIG. 4, this is only for illustrative purpose, and it is not limited thereto. Furthermore, although it is illustrated that the first nanowire 120 has a square cross section, it is not limited thereto. In some embodiments, the corner of the first nanowire 120 may be rounded by a process such as trimming.

The first nanowire 120 may be used as a channel region for a transistor. A material of the first nanowire 120 may vary depending on whether the semiconductor device is a PMOS or NMOS, but the disclosure is not limited thereto.

The first nanowire 120 may include the same material as that of the fin-type pattern 110, or include a material different from that of the fin-type pattern 110. For convenience of explanation, in the following description it will be assumed that the first nanowire 120 of the semiconductor device includes silicon.

The gate electrode 130 may be formed on the field insulating layer 105 and the fin-type pattern 110. The gate electrode 130 may extend in the second direction Y.

The gate electrode 130 may be so formed as to surround a periphery of the first nanowire 120 which is spaced apart from a top surface of the fin-type pattern 110. The gate electrode 130 may be also formed in a space defined between the first nanowire 120 and the fin-type pattern 110.

The gate electrode 130 may include a conductive material. As illustrated, the gate electrode 130 may be a single layer, but the disclosure is not limited thereto. For example, the gate electrode 130 may include a work function conductive layer which adjusts a work function, and a filling conductive layer which fills a space formed by the work function conductive layer.

The gate electrode 130 may include at least one of TiN, WN, TaN, Ru, TiC, TaC, Ti, Ag, Al, TiAl, TiAlN, TiAlC, TaCN, TaSiN, Mn, Zr, W, and Al. Alternatively, the gate electrode 130 may each be formed of non-metal element such as Si or SiGe. The gate electrode 130 described above may be formed by a replacement process, but the disclosure is not limited thereto.

The gate spacer 140 may be formed on both (e.g., opposite) sidewalls of the gate electrode 130 which extends in the second direction Y. The gate spacer 140 may be formed on both sides of the first nanowire 120, to have portions facing each other. The gate spacer 140 may include a through hole 140h. The first nanowire 120 may include opposite first and second side surfaces. Accordingly, the gate spacer 140 may include a first gate spacer 140a which is in contact with the first side surface, and a second gate spacer 140b which is in contact with the second side surface. The gate spacer 140 may be described herein as a single gate spacer having portions, which may be referred to as first portions, second portions, third portions, etc. The different portions may also each be referred to as a gate spacer.

The first nanowire 120 may pass through the gate spacer 140. The first nanowire 120 may pass through the through hole 140h. The gate spacer 140 may completely surround a periphery of a portion of side surfaces of the first nanowire 120.

When a corner of the first nanowire 120, which is surrounded by the gate electrode, is rounded by the process such as trimming, a cross section of the first nanowire 120 in contact with the gate spacer 140 may be different from a cross section of the first nanowire 120 surrounded by the gate electrode 130.

The first gate spacer 140a may include a first outer spacer 141a and a portion of an inner spacer 142. The portion of the inner spacer 142 that is included in the first gate spacer 140a may also be referred to as a first inner spacer. The first outer spacer 141a may be in contact with the inner spacer 142. The inner spacer 142 may be disposed between the top surface of the fin-type pattern 110 and the first nanowire 120, and may be in surface contact with the top surface of the fin-type pattern 110. On an YZ cross section, the inner spacer 142 may be surrounded by the first nanowire 120, the first outer spacer 141a and the fin-type pattern 110.

The second gate spacer 140b may include a second outer spacer 141b and a portion of the inner spacer 142. The portion of the inner spacer 142 that is included in the second gate spacer 140b may also be referred to as a second inner spacer. The second outer spacer 141b may be in contact with the inner spacer 142. The inner spacer 142 may be disposed between the top surface of the fin-type pattern 110 and the first nanowire 120, and may be in surface contact with the top surface of the fin-type pattern 110. On an YZ cross section, the inner spacer 142 may be surrounded by the first nanowire 120, the second outer spacer 141b and the fin-type pattern 110.

The first gate spacer 140a and the second gate spacer 140b may have the same shape and material as each other.

Hereinafter, the shape of the first gate spacer 140a will be described by way of example embodiments.

The through hole 140h of the first gate spacer 140a may be defined by the first outer spacer 141a and the inner spacer 142. An end portion of the first nanowire 120 may be in contact with the first outer spacer 141a and the inner spacer 142.

Referring to FIG. 6, the through hole 140h may include two first sides 140h-1 facing each other in the second direction Y, and two second sides 140h-2 facing each other in a third direction Z. The second sides 140h-2 of the through hole 140h may connect the first sides 140h-1 of the through hole 140h which are facing each other.

In the semiconductor device according to example embodiments, at least one of the second sides 140h-2 of the through hole 140h may be defined by the inner spacer 142. The first sides 140h-1 of the through hole 140h may be defined by the first outer spacer 141a.

More specifically, the through hole 140h may include the three sides, e.g., the two first sides 140h-1 and one of the second sides 140h-2 defined by the first outer spacer 141a, and the one side, e.g., the other one of the second sides 140h-2 defined by the inner spacer 142.

For example, the first sides 140h-1 of the through hole 140h may be defined by the first outer spacer 141a. Furthermore, one of the second sides 140h-2 of the through hole 140h may be defined by the first outer spacer 141a, and the other second side 140h-2 of the through hole 140h may be defined by the inner spacer 142.

The first outer spacer 141a and the inner spacer 142 may include different materials from each other. When a material included in the first outer spacer 141a has a first dielectric constant, and a material included in the inner spacer 142 has a second dielectric constant, the first and second dielectric constants may be different from each other.

In the semiconductor device according to example embodiments, the material included in the first outer spacer 141a may have a greater dielectric constant than the material included in the inner spacer 142. It is possible to reduce the fringing capacitance between the gate electrode 130 and the source/drain 150 by having the second dielectric constant lower than the first dielectric constant.

For example, the first outer spacer 141a may include at least one of silicon nitride (SiN), silicon oxynitride (SiON), silicon oxide (SiO$_2$), silicon oxycarbidenitride (SiOCN), and a combination thereof. For example, the inner spacer 142 may include at least one of a low-k dielectric material, silicon nitride (SiN), silicon oxynitride (SiON), silicon oxide (SiO$_2$), silicon oxycarbidenitride (SiOCN), and a combination thereof. However, as mentioned earlier, according to example embodiments, the material included in the first outer spacer 141a may have a greater dielectric constant than the material included in the inner spacer 142. The low-k dielectric material may be a material that has a lower dielectric constant than silicon oxide.

The first outer spacer 141a of the first gate spacer 140a may include a first region 141a-1 and a second region 141a-2. The second region 141a-2 may be disposed on both sides of the first region 141a-1 in the second direction Y.

The first region 141a-1 may be a region where the first nanowire 120 is passed through. The second region 141a-2 may be a region where the first nanowire 120 need not pass through. For example, the through hole 140h of the gate spacer 140a may be included in the first region 141a-1. More specifically, the through hole 140h may be surrounded by the first region 141a-1 and the inner spacer 142.

The second region 141a-2 may include the first outer spacer 141a only. Meanwhile, the first region 141a-1 may include the first outer spacer 141a and the inner spacer 142. More specifically, the first region 141a-1 may include a portion of the first outer spacer 141a.

A height from a top surface of the substrate 100 to the first region 141a-1 of the gate spacer may be greater than a height from the top surface of the substrate 100 to the inner spacer 142. At least one of the second sides 140h-2 of the through hole 140h may be defined by the inner spacer 142. The first sides 140h-1 of the through hole 140h may be defined by the first outer spacer 141a.

The inner spacer 142 may be in contact with the second region 141a-2. Furthermore, the second region 141a-2 and the first region 141a-1 may be included in the first outer spacer 141a. Accordingly, the second region 141a-2 and the first region 141a-1 may be an integral structure.

There may be no layer between an uppermost portion of the first nanowire 120 and the first outer spacer 141a, for example, at an overlapping portion between the first gate spacer 140a and the first nanowire 120. In other words, the uppermost portion of the first nanowire 120 may be in contact with the first region 140a-1 of the gate spacer 140.

Accordingly, a lowermost portion of the first nanowire 120 may be in contact with the inner spacer 142 of the gate spacer 140, and the uppermost portion of the first nanowire 120 may be in contact with the first region 140a-1 of the gate spacer 140.

Referring to FIGS. 2 and 3, the inner spacer 142 may include a spaced portion 142c, a first protruding portion 142a and a second protruding portion 142b.

The spaced portion 142c may be formed to be spaced apart from the first nanowire 120. A lower surface of the spaced portion 142c may be in contact with the top surface of the fin-type pattern 110. For example, the lower surface of the spaced portion 142c may be formed along the top surface of the fin-type pattern 110.

The protruding portions 142a and 142b may extend from the spaced portion 142c. The first protruding portion 142a and the second protruding portion 142b may be connected to both ends of the spaced portion 142c. Accordingly, the gate electrode 130 may be formed between the first protruding portion 142a and the second protruding portion 142b. For example, the first protruding portion 142a and the second protruding portion 142b may each be formed on both sides of the gate electrode 130.

The first protruding portion 142a may be vertically overlapped with the first outer spacer 141a. A width of the first protruding portion 142a may be the same as that of the first outer spacer 141a. But the disclosure is not limited thereto.

Similarly, the second protruding portion 142b may vertically overlap the second outer spacer 141b. A width of the second protruding portion 142b may be the same as that of the second outer spacer 141b. But the disclosure is not limited thereto.

The first gate spacer 140a may include the first outer spacer 141a and the first protruding portion 142a of the inner spacer 142. Similarly, the second gate spacer 140b may include the second outer spacer 141b and the second protruding portion 142b of the inner spacer 142. The spaced portion 142c of the inner spacer 142 may be a spacer connector which connects the first gate spacer 140a to the second gate spacer 140b. For example, the first gate spacer 140a and the second gate spacer 140b formed opposite to each other around the gate electrode 130 may be connected to each other by the spaced portion 142c (i.e., the spacer connector) of the inner spacer 142.

In some embodiments, the inner spacer 142 may not include the protruding portions 142a and 142b. In this case, a top surface of the inner spacer 142 may be completely in contact with a lower surface of the first nanowire 120. For example, the inner spacer 142 may have the flat top surface, and extend in the first direction X.

The gate insulating layer 147 may be formed between the first nanowire 120 and the gate electrode 130. Furthermore, the gate insulating layer 147 may be formed between the field insulating layer 105 and the gate electrode 130, and between the inner spacer 142 and the gate electrode 130.

For example, the gate insulating layer 147 may include an interface layer 146 and a high-k insulating layer 145, but the disclosure is not limited thereto. For example, the interface layer 146 of the gate insulating layer 147 may be omitted depending on a material for the first nanowire 120.

Because the interface layer 146 may be formed on a periphery of the first nanowire 120, the interface layer 146 may be formed between the first nanowire 120 and the gate electrode 130, and between the fin-type pattern 110 and the gate electrode 130. Meanwhile, the high-k insulating layer 145 may be formed between the first nanowire 120 and the gate electrode 130, between the inner spacer 142 and the gate electrode 130, between the field insulating layer 105 and the gate electrode 130, and between the outer spacer 141 and the gate electrode 130.

The gate insulating layer 147 may be formed along the periphery of the first nanowire 120. The gate insulating layer 147 may be formed along a top surface of the field insulating layer 105, and a top surface of the spaced portion 142c of the inner spacer 142. In addition, the gate insulating layer 147 may be formed along sidewalls of the inner spacer 142 and the outer spacer 141.

When the first nanowire 120 includes silicon, the interface layer 146 may include a silicon oxide layer. In this embodiment, when the interface layer 146 includes a silicon oxide layer, the interface layer 146 may be formed on the periphery of the first nanowire 120 and the top surface of the inner spacer 142, but need not be formed along the sidewalls of the inner spacer 142 and the outer spacer 141.

The high-k insulating layer 145 may include a high-k dielectric material having a higher dielectric constant than a silicon oxide layer. For example, the high-k dielectric material may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the disclosure is not limited thereto.

As described above, when the interface layer 146 is omitted, the high-k insulating layer 145 may include not only the high-k dielectric material, but also silicon oxide layer, silicon oxynitride layer, or silicon nitride layer.

In some embodiments, the source/drain 150 may be formed on both sides of the gate electrode 130. The source/drain 150 may be formed on the fin-type pattern 110. The source/drain 150 may include an epitaxial layer formed on the top surface of the fin-type pattern 110.

An outer circumference of the source/drain 150 may have a variety of shapes. For example, the outer circumference of the source/drain 150 may be at least one of diamond, circle, rectangle, and octagon shapes. FIG. 1 illustrates a diamond shape (or pentagon or hexagon shape), for an example.

The source/drain 150 may be directly connected with the first nanowire 120 which is used as the channel region. For example, the source/drain 150 may be directly connected with the first nanowire 120 which is passed through the through hole 140*h* of the gate spacer 140.

However, the source/drain 150 need not be in contact with the gate insulating layer 147. The gate spacer 140 may be located between the source/drain 150 and the gate insulating layer 147. For example, one sidewall of the inner spacer 142 may be in contact with the gate insulating layer 147, while the other sidewall of the inner spacer 142 may be in contact with the source/drain 150, in which case the source/drain 150 and the gate insulating layer 147 need not contact each other between the first nanowire 120 and the substrate 100. Furthermore, since the outer spacer 141 is in contact with the uppermost portion of the first nanowire 120, the source/drain 150 and the gate insulating layer 147 need not contact each other over the first nanowire 120.

Hereinafter, a semiconductor device according to another example embodiment of the inventive concept will be explained with reference to FIGS. 1 and 7 to 9. For convenience of explanation, differences that are not explained above with reference to FIGS. 1 to 6 will be mainly explained below.

Figure 7:
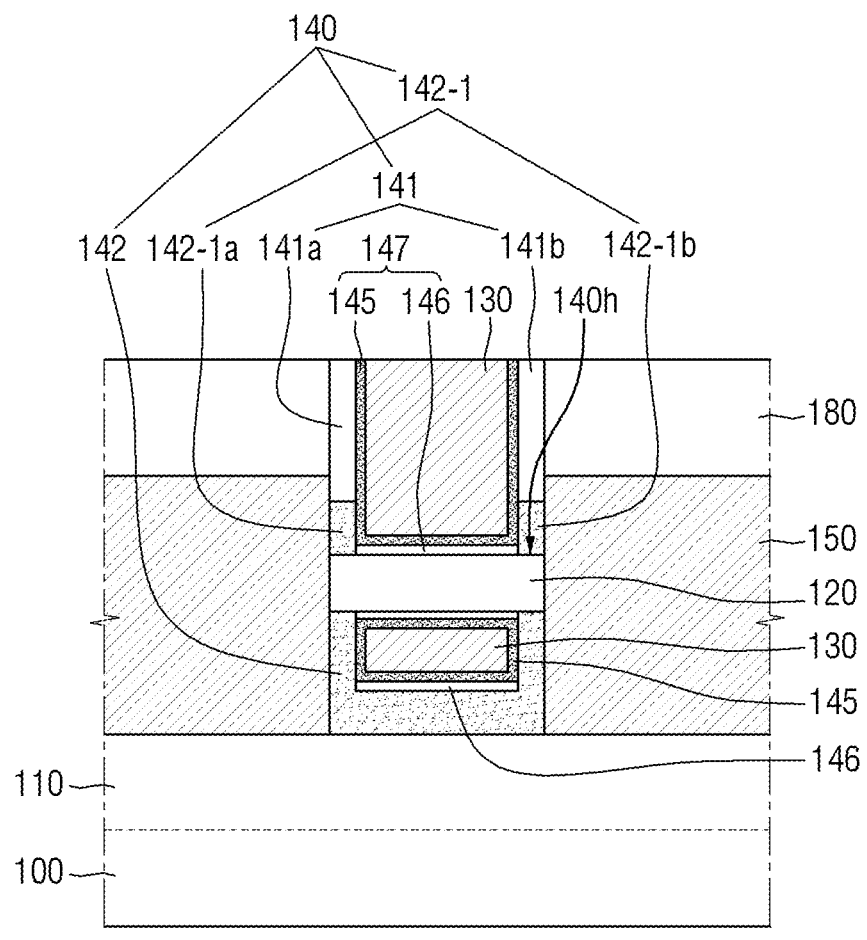
FIG. 7 is a cross-sectional view illustrating a semiconductor device according to some example embodiments of the inventive concept.
Figure 8:
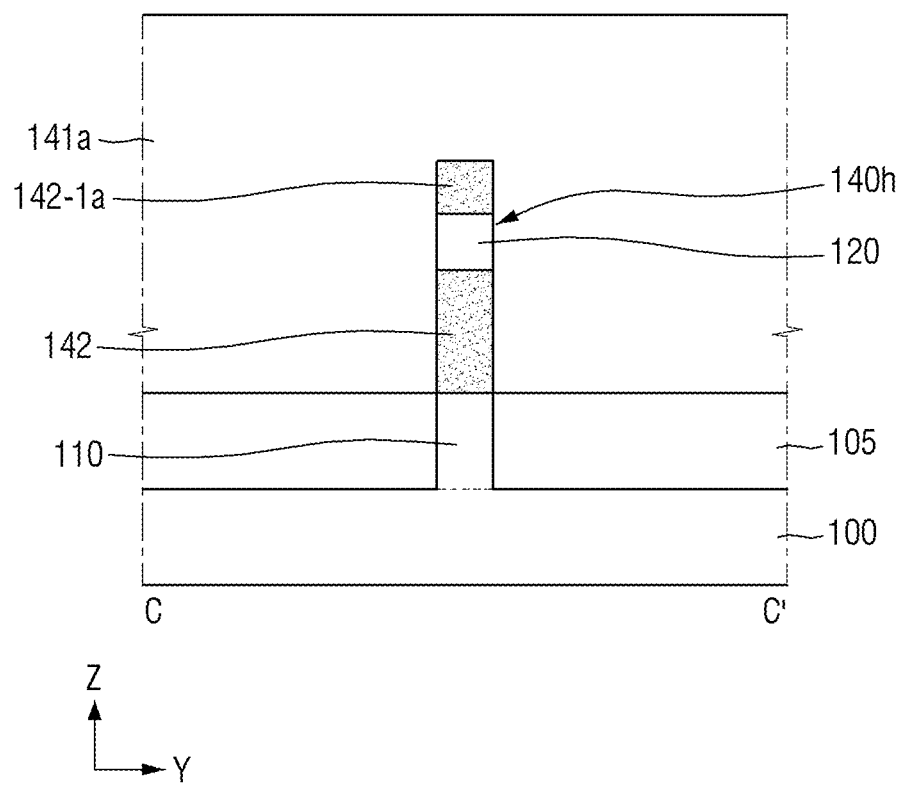
FIG. 8 is a cross-sectional view illustrating the semiconductor device of FIG. 7.
Figure 9:
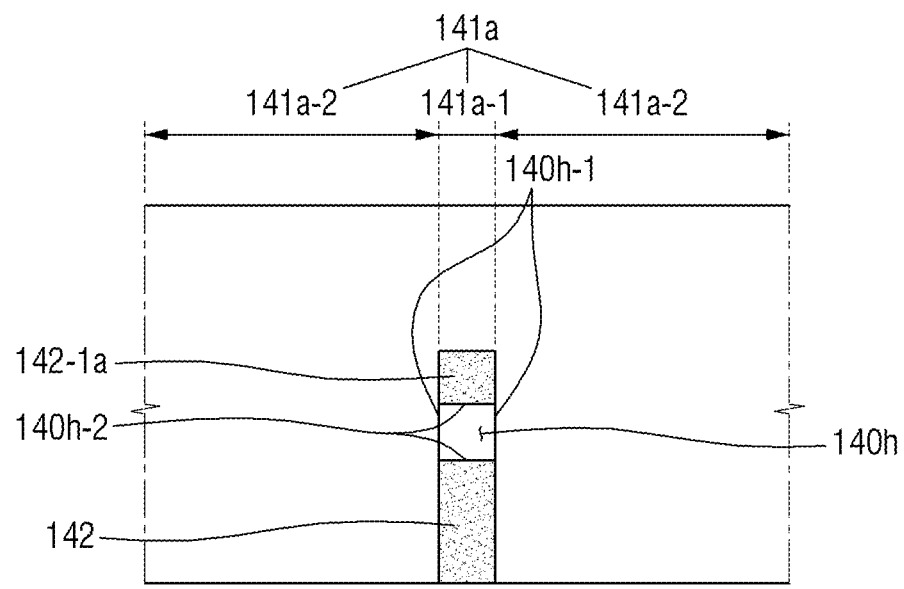
FIG. 9 is a cross-sectional view illustrating an inner spacer and an outer spacer of FIG. 8 in detail.

FIG. 7 is a cross-sectional view illustrating a semiconductor device according to some exemplary embodiments of the inventive concept. FIG. 8 is a cross-sectional view illustrating the semiconductor device of FIG. 7. FIG. 9 is a cross-sectional view illustrating an inner spacer and an outer spacer of FIG. 8 in detail.

For reference, FIG. 7 is a cross-sectional view taken along line A-A' of FIG. 1. FIG. 8 is a cross-sectional view taken along line C-C' of FIG. 1. FIG. 9 illustrates only the gate spacer of FIG. 7.

Referring to FIGS. 1 and 7 to 9, a semiconductor device according to some embodiments may include a lower inner spacer 142 and an upper inner spacer 142-1 which is spaced apart from the lower inner spacer 142 in a third direction Z. The upper inner spacer 142-1 may include a first upper inner spacer 142-1*a* which is contacted with the first sidewall of the gate electrode 130 and a second upper inner spacer 142-1*b* which is contacted with the second sidewall of the gate electrode 130 opposite to the first sidewall of the gate electrode 130.

Accordingly, the uppermost portion of the first nanowire 120 may be in contact with the upper inner spacer 142-1, and the lowermost portion of the first nanowire 120 may be in contact with the lower inner spacer 142.

In the first region 141*a*-1, the lower inner spacer 142 and the first upper inner spacer 142-1*a* may be disposed over and under the first nanowire 120, respectively. The lower inner spacer 142 and the first upper inner spacer 142-1*a* may include a material having a lower dielectric constant than the first outer spacer 141*a*.

The through hole 140*h* may include two sides 140*h*-1 which are defined by the first outer spacer 141*a*, and two sides 140*h*-2 which are defined by the lower inner spacer 142 and the first upper inner spacer 142-1*a*.

In some embodiments, first sides 140*h*-1 of the through hole 140*h* facing each other in the second direction Y may be defined by the first outer spacer 141*a*, and second sides 140*h*-2 of the through hole 140*h* facing each other in the third direction Z may be defined by the lower inner spacer 142 and the first upper inner spacer 142-1*a*.

The second gate spacer 140*b* is substantially the same shape as that of the first gate spacer 140*a*, so a detailed description thereof is omitted and replaced by the description of the first gate spacer 140*a*.

A semiconductor device according to still another exemplary embodiment of the inventive concept will be explained with reference to FIGS. 1 and 10 to 12. For convenience of explanation, differences that are not explained above with reference to FIGS. 1 to 9 will be mainly explained below.

Figure 10:
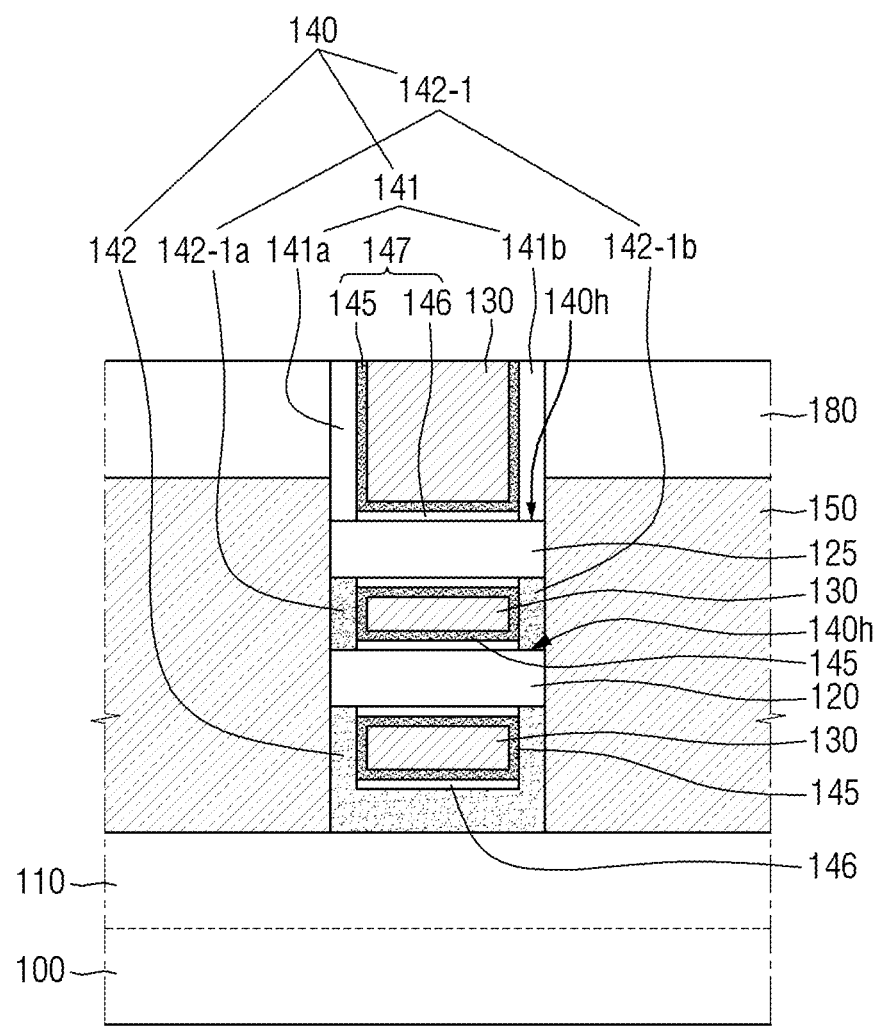
FIG. 10 is a cross-sectional view illustrating a semiconductor device according to some example embodiments of the inventive concept.
Figure 11:
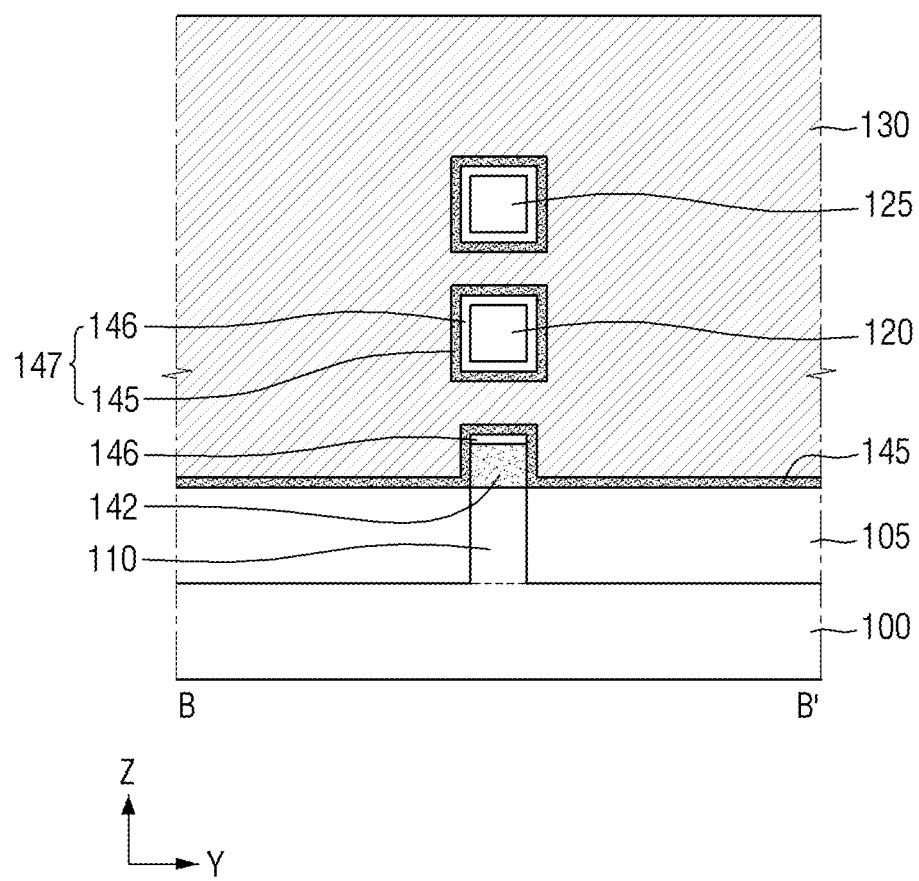
FIG. 11 is a cross-sectional view illustrating the semiconductor device of FIG. 10.
Figure 12:
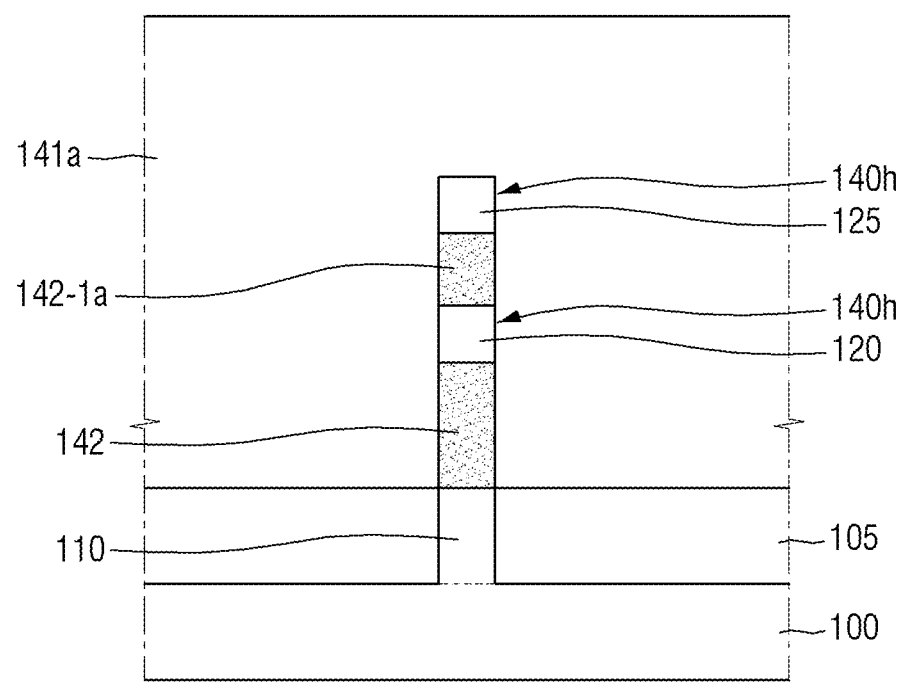
FIG. 12 is a cross-sectional view illustrating the semiconductor device of FIG. 10.

FIGS. 10 to 12 are cross-sectional views illustrating a semiconductor device according to some example embodiments of the inventive concept.

FIG. 10 is a cross-sectional view taken along line A-A' of FIG. 1. FIG. 11 is a cross-sectional view taken along line B-B' of FIG. 1. FIG. 12 is a cross-sectional view taken along line C-C' of FIG. 1.

Referring to FIGS. 1 and 10 to 12, a semiconductor device according to some example embodiments of the inventive concept may further include a second nanowire 125.

The second nanowire 125 may be formed on the substrate 100, while being spaced apart from the substrate 100. The second nanowire 125 may extend in the first direction X.

The second nanowire 125 may be spaced apart from the substrate 100 further than the first nanowire 120. For example, a height from the top surface of the fin-type pattern 110 to the second nanowire 125 may be greater than a height from the top surface of the fin-type pattern 110 to the first nanowire 120. More specifically, in some embodiments, a height from the uppermost surface of the fin-type pattern 110 (or the uppermost surface of the substrate 100) to the lowermost surface of the second nanowire 125 may be greater than a height from the uppermost surface of the fin-type pattern 110 (or the uppermost surface of the substrate 100) to the lowermost surface of the first nanowire 120. In some embodiments, a height from the uppermost surface of the fin-type pattern 110 (or the uppermost surface of the substrate 100) to the uppermost surface of the second nanowire 125 may be greater than a height from the uppermost surface of the fin-type pattern 110 (or the uppermost surface of the substrate 100) to the uppermost surface of the first nanowire 120.

The second nanowire 125 may be overlapped with the fin-type pattern 110. The second nanowire 125 may be formed on the fin-type pattern 110, rather than being formed on the field insulating layer 105.

The second nanowire 125 may be used as a channel region for the transistor. Accordingly, the second nanowire 125 may include the same material as the first nanowire 120.

The gate electrode 130 may be formed to surround the periphery of the second nanowire 125. The gate electrode 130 may be also formed in the space defined between the first nanowire 120 and the second nanowire 125.

The gate spacer 140 may be disposed on both ends of the first nanowire 120 and on both ends of the second nanowire 125. The gate spacer 140 may each include a plurality of through holes 140*h*.

The second nanowire 125 may pass through the gate spacer 140. The second nanowire 125 may pass through one of the plurality of through holes 140*h*. The periphery of the end of the second nanowire 125 may be contacted with the gate spacer 140.

Like the first nanowire 120, when the corner of the second nanowire 125, which is surrounded by the gate electrode 130, is rounded by the process such as trimming, the end of the second nanowire 125 in contact with the gate spacer 140 may have a different cross section than a cross section of the second nanowire 125 surrounded by the gate electrode 130.

The second nanowire 125 may be aligned with the first nanowire 120. The second nanowire 125 may be overlapped with the first nanowire 120 in the third direction Z. The first nanowire 120 and the second nanowire 125 may have the same length as each other. But the disclosure is not limited thereto.

The lower inner spacer 142 may be disposed between the top surface of the fin-type pattern 110 and the first nanowire 120. The first upper inner spacer 142-1 may be disposed between the first nanowire 120 and the second nanowire 125.

Referring to FIG. 10, the uppermost surface of the second nanowire 125 may be in contact with the outer spacer 141, and the lowermost surface of the second nanowire 125 may be in contact with the first upper inner spacer 142-1.

The gate insulating layer 147 may be formed between the second nanowire 125 and the gate electrode 130. The gate insulating layer 147 may be formed along the periphery of the second nanowire 125.

The source/drain 150 may be directly connected to the second nanowire 125 which is used as the channel region. For example, the source/drain 150 may be directly connected to the first nanowire 120 and the second nanowire 125 which are passed through the through holes 140h of the gate spacer 140.

Hereinafter, a semiconductor device according to still another exemplary embodiment of the inventive concept will be explained with reference to FIGS. 1 and 13 to 15. For convenience of explanation, differences that are not explained above with reference to FIGS. 1 to 12 will be mainly explained below.

Figure 13:
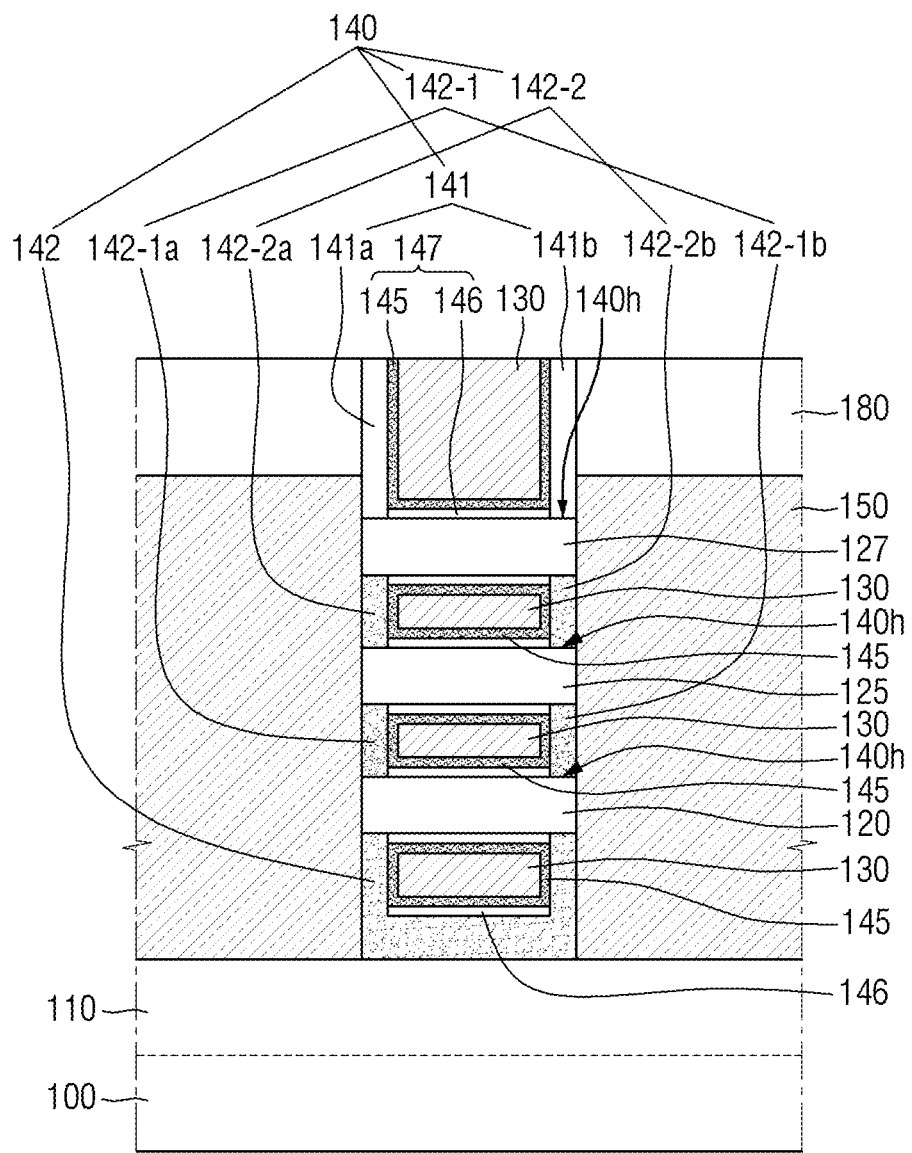
FIG. 13 is a cross-sectional view illustrating a semiconductor device according to some example embodiments of the inventive concept.
Figure 14:
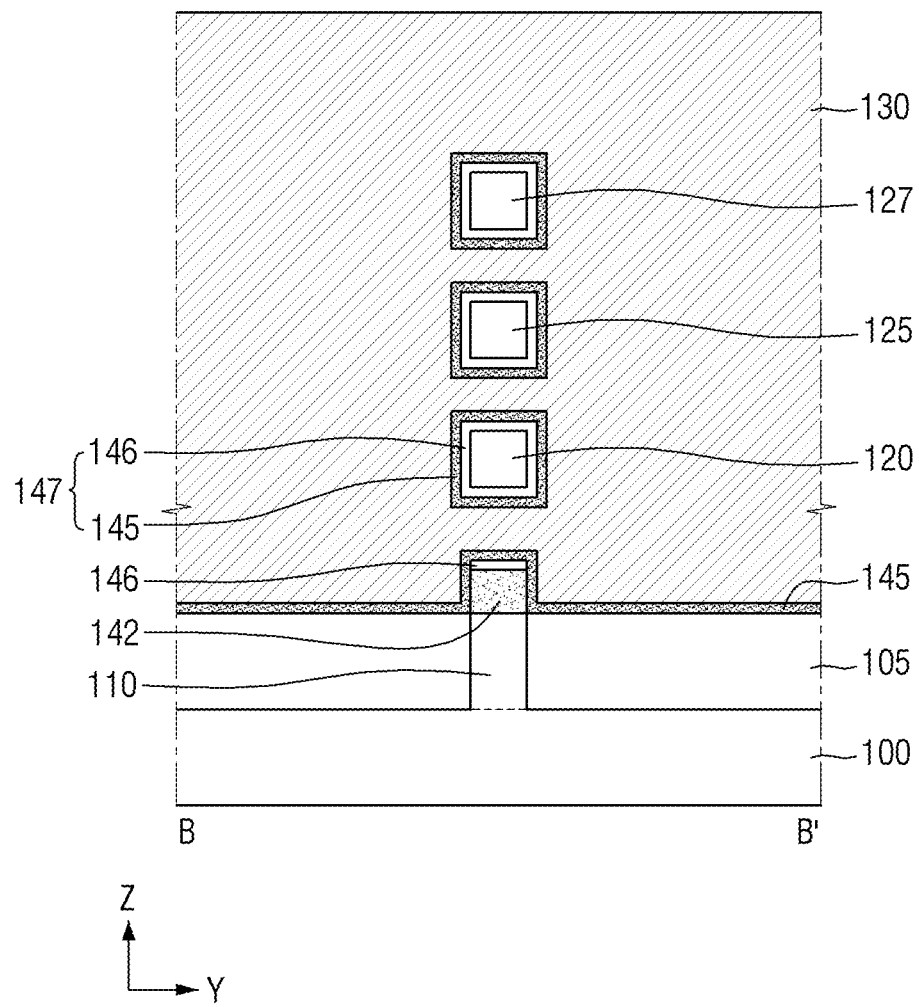
FIG. 14 is a cross-sectional view illustrating the semiconductor device of FIG. 13.
Figure 15:
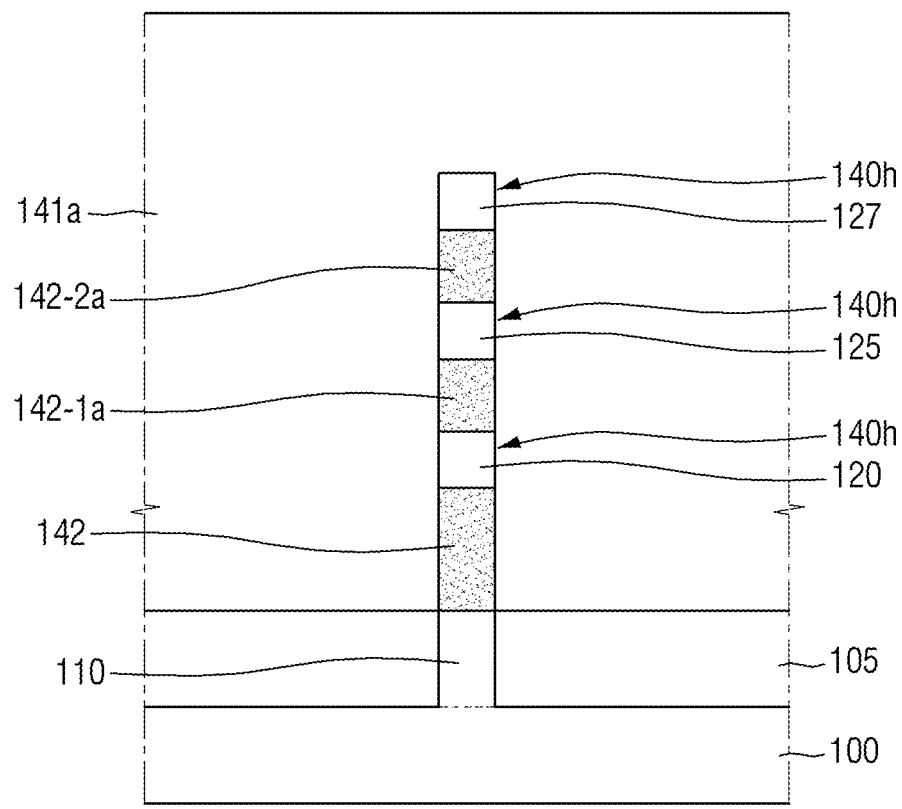
FIG. 15 is a cross-sectional view illustrating the semiconductor device of FIG. 13.

FIGS. 13 to 15 are cross-sectional views illustrating a semiconductor device according to some example embodiments of the inventive concept.

FIG. 13 is a cross-sectional view taken along line A-A' of FIG. 1. FIG. 14 is a cross-sectional view taken along line B-B' of FIG. 1. FIG. 15 is a cross-sectional view taken along line C-C' of FIG. 1.

Referring to FIGS. 1 and 13 to 15, a semiconductor device according to some example embodiments of the inventive concept may further include a third nanowire 127 and a second upper inner spacer 142-2.

The third nanowire 127 may be formed on the substrate 100, while being spaced apart from the substrate 100. The third nanowire 127 may extend in the first direction X.

The third nanowire 127 may be spaced apart from the substrate 100 further than the first nanowire 110 and the second nanowire 125. For example, a height from the top surface of the fin-type pattern 110 to the third nanowire 127 may be greater than a height from the top surface of the fin-type pattern 110 to the first nanowire 120 or second nanowire 125. More specifically, in some embodiments, a height from the uppermost surface of the fin-type pattern 110 (or the uppermost surface of the substrate 100) to the lowermost surface of the third nanowire 127 may be greater than a height from the uppermost surface of the fin-type pattern 110 (or the uppermost surface of the substrate 100) to the lowermost surface of the first nanowire 120 or the lowermost surface of the second nanowire 125. In some embodiments, a height from the uppermost surface of the fin-type pattern 110 (or the uppermost surface of the substrate 100) to the uppermost surface of the third nanowire 127 may be greater than a height from the uppermost surface of the fin-type pattern 110 (or the uppermost surface of the substrate 100) to the uppermost surface of the first nanowire 120 or the uppermost surface of the second nanowire 125.

The third nanowire 127 may be overlapped with the fin-type pattern 110. In some embodiments, the third nanowire 127 may be formed on the fin-type pattern 110, rather than being formed on the field insulating layer 105.

The third nanowire 127 may be used as a channel region for the transistor. Accordingly, the third nanowire 127 may include the same material as the first nanowire 120 and the second nanowire 125.

The gate electrode 130 may be formed to surround the periphery of the third nanowire 127. The gate electrode 130 may be also formed in the space defined between the second nanowire 125 and the third nanowire 127.

The gate spacer 140 may be disposed on both ends of the first nanowire 120, on both ends of the second nanowire 125, and on both ends of the third nanowire 127. The gate spacer 140 may each include a plurality of through holes 140h.

The third nanowire 127 may pass through the gate spacer 140. The third nanowire 127 may pass through one of the plurality of through holes 140h. The periphery of the end of the third nanowire 127 may be completely contacted with the gate spacer 140.

Like the first nanowire 120 and the second nanowire 125, when the corner of the third nanowire 127, which is surrounded by the gate electrode 130, is rounded by the process such as trimming, the end of the third nanowire 127 in contact with the gate spacer 140 may have a different cross section than a cross section of the third nanowire 127 surrounded by the gate electrode 130.

The third nanowire 127 may be aligned with the first nanowire 120 and the second nanowire 125. The third nanowire 127 may be overlapped with the first nanowire 120 and the second nanowire 125 in the third direction Z. In some embodiments, the first to third nanowires 120, 125 and 127 may have the same length as each other. But the disclosure is not limited thereto.

The lower inner spacer 142 may be disposed between the top surface of the fin-type pattern 110 and the first nanowire 120. The first upper inner spacer 142-1 may be disposed between the first nanowire 120 and the second nanowire 125. The second upper inner spacer 142-2 may be disposed between the second nanowire 125 and the third nanowire 127. The second upper inner spacer 142-2 may include a second upper inner spacer 142-2a which is contacted with the first sidewall of the gate electrode 130, and a second upper inner spacer 142-2b which is contacted with the second sidewall of the gate electrode 130.

Referring to FIG. 13, the uppermost surface of the third nanowire 127 may be in contact with the outer spacer 141, and the lowermost surface of the third nanowire 127 may be in contact with the second upper inner spacer 142-2. But the disclosure is not limited thereto.

The gate insulating layer 147 may be formed between the third nanowire 127 and the gate electrode 130. The gate insulating layer 147 may be formed along the periphery of the third nanowire 127.

The source/drain 150 may be directly connected to the third nanowire 127 which is used as the channel region. For example, the source/drain 150 may be directly connected to the first to third nanowires 120, 125 and 127 which are passed through the through holes 140h of the gate spacer 140.

Hereinafter, a semiconductor device according to still another exemplary embodiment of the inventive concept will be explained with reference to FIGS. 1 and 16 to 18. For convenience of explanation, differences that are not explained above with reference to FIGS. 1 to 15 will be mainly explained below.

Figure 16:
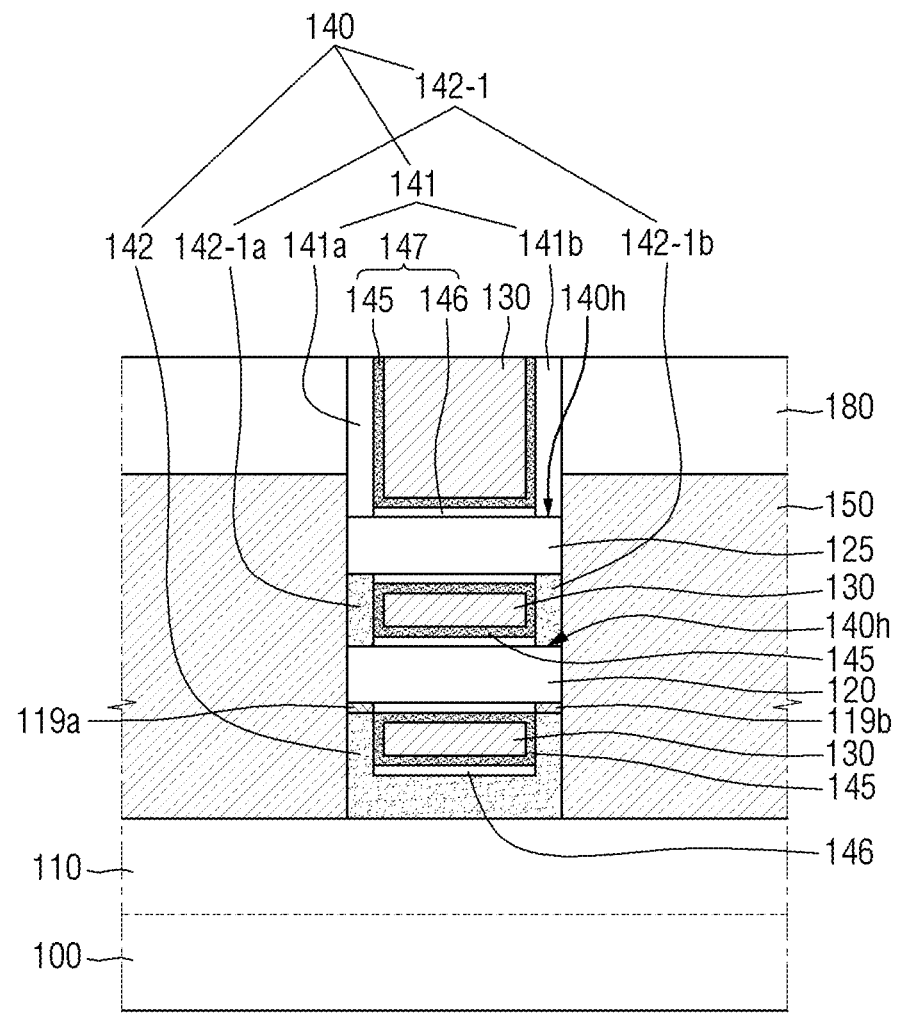
FIG. 16 is a cross-sectional view illustrating a semiconductor device according to some example embodiments of the inventive concept.
Figure 17:
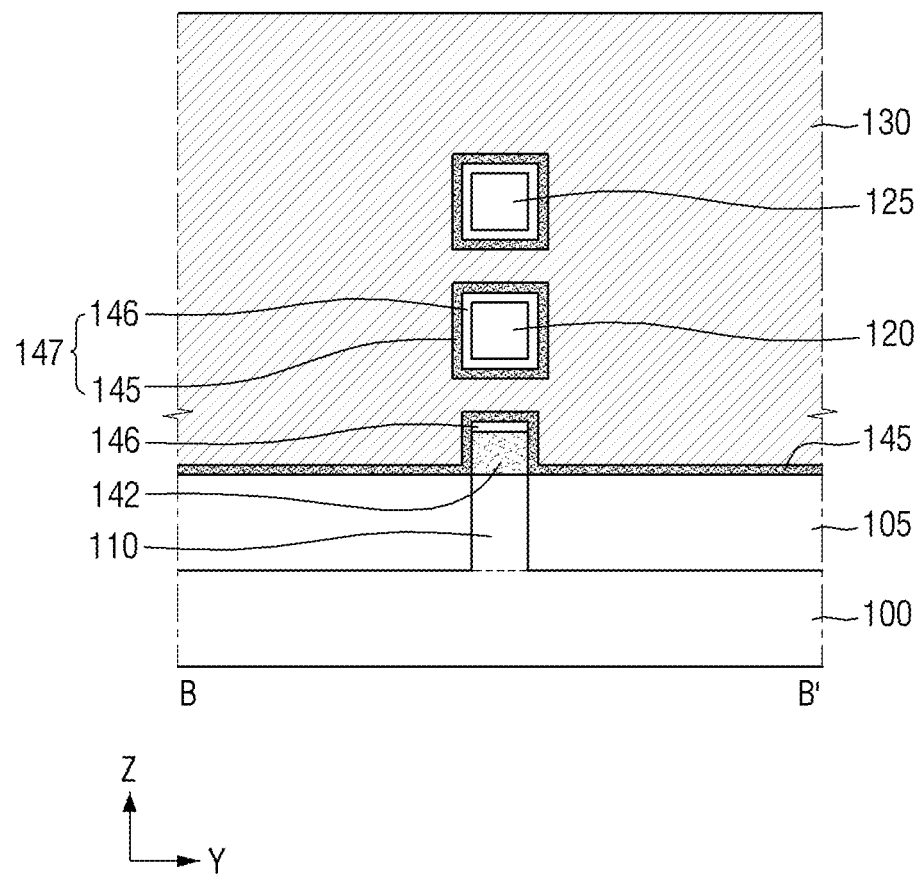
FIG. 17 is a cross-sectional view illustrating the semiconductor device of FIG. 16.
Figure 18:
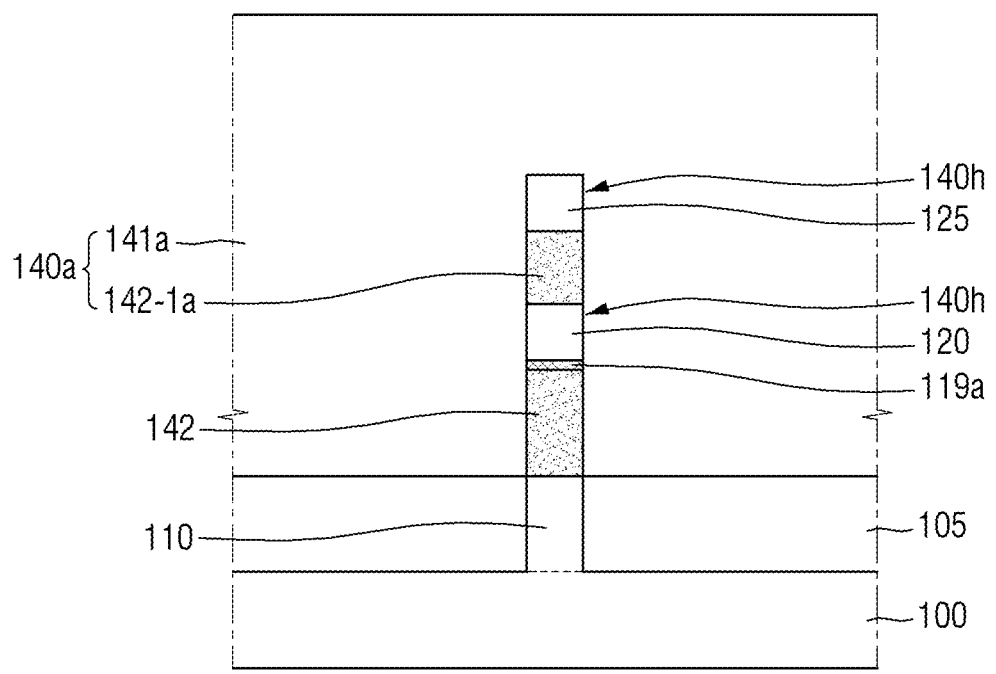
FIG. 18 is a cross-sectional view illustrating the semiconductor device of FIG. 16.

FIGS. 16 to 18 are cross-sectional views illustrating a semiconductor device according to some example embodiments of the inventive concept.

FIG. 16 is a cross-sectional view taken along line A-A' of FIG. 1. FIG. 17 is a cross-sectional view taken along line B-B' of FIG. 1. FIG. 18 is a cross-sectional view taken along line C-C' of FIG. 1.

Referring to FIGS. 1 and 16 to 18, a semiconductor device according to some example embodiments of the inventive concept may include a passivation layer 119.

The passivation layer 119 may be formed for preventing a loss of the first nanowire 120 during the etching process. The passivation layer 119 may be formed between the top surfaces of the protruding portions 142*a* and 142*b* of the lower inner spacer 142 and the lower surface of the first nanowire 120.

The passivation layer 119 may include a first passivation layer 119*a* and a second passivation layer 119*b*. The first passivation layer 119*a* may be formed on the first protruding portion 142*a*. The second passivation layer 119*a* may be formed on the second protruding portion 142*b*.

A width of the first passivation layer 119*a* may be the same as that of the first protruding portion 142*a*. A width of the second passivation layer 119*b* may be the same as that of the second protruding portion 142*b*. The passivation layer 119 may include silicon.

Hereinafter, a method for fabricating a semiconductor device according to example embodiments of the inventive concept will be explained with reference to FIGS. 19 to 36. The semiconductor device fabricated based FIGS. 19 to 36 corresponds to the semiconductor device described above with reference to FIGS. 7 to 9.

FIGS. 19 to 36 are drawings illustrating a method for fabricating a semiconductor device according to example embodiments of the inventive concept. FIGS. 31, 33 and 35 are cross-sectional views taken along line D-D' of FIG. 30. FIGS. 32, 34 and 36 are cross-sectional views taken along line E-E' of FIG. 30.

Figure 19:
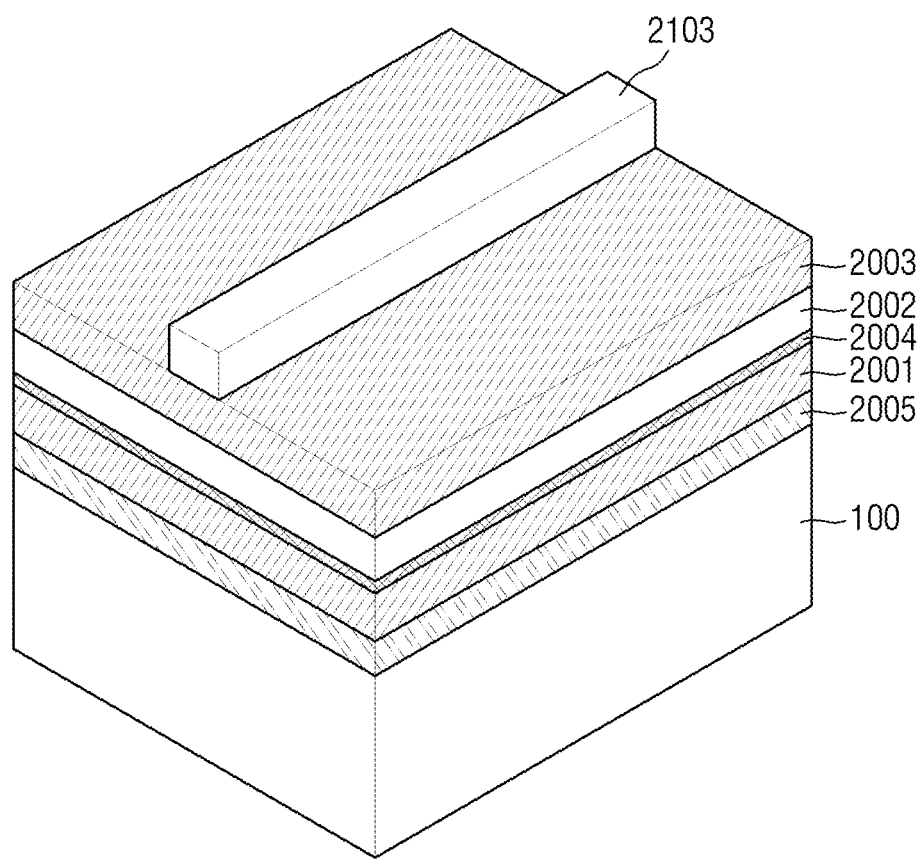

Referring to FIG. 19, a lower sacrificial layer 2005, a first sacrificial layer 2001, a free passivation layer 2004, an active layer 2002 and a second sacrificial layer 2003 may be sequentially formed on the substrate 100.

The first sacrificial layer 2001 and the second sacrificial layer 2003 may include the same material, and the first sacrificial layer 2001 and the active layer 2002 may include different materials. In explaining a method for fabricating a semiconductor device according to an example embodiment, it is assumed that the first sacrificial layer 2001 and the second sacrificial layer 2003 include the same material. Furthermore, the active layer 2002 may include a material with an etch selectivity with respect to the first sacrificial layer 2001.

The lower sacrificial layer 2005 may include the same material as the first sacrificial layer 2001 and the second sacrificial layer 2003, but they may be doped with different materials with the doping concentrations.

For example, the substrate 100 and the active layer 2002 may include a material used as a channel region for the transistor. In the case of PMOS transistors, the active layer 2002 may include a material with high hole mobility, while in the case of NMOS transistors, the active layer 2002 may include a material with high electron mobility.

The first sacrificial layer 2001 and the second sacrificial layer 2003 may include a material having a similar lattice constant and lattice structure as the active layer 2002. For example, the first sacrificial layer 2001 and the second sacrificial layer 2003 may be a semiconductor material or a crystallized metal material.

In explaining a method for fabricating a semiconductor device according to an example embodiment, it is assumed that the active layer 2002 includes silicon, and the first sacrificial layer 2001 and the second sacrificial layer 2003 each include silicon germanium. Furthermore, the lower sacrificial layer 2005 may also include silicon germanium.

A germanium concentration of the lower sacrificial layer 2005 may be greater than that of each of the first sacrificial layer 2001 and second sacrificial layer 2003. Through this, an etching rate of the lower sacrificial layer 2005 may be markedly increased compared to an etching rate of each of the first sacrificial layer 2001 and the second sacrificial layer 2003 during the etching process.

FIG. 19 illustrates only one active layer 2002, but this is only for convenience of explanation and the example embodiments are not limited thereto. For example, there may be plural pairs of the first sacrificial layer 2001 and the active layer 2002 formed in turn, with the second sacrificial layer 2003 being formed on the uppermost active layer 2002.

Furthermore, although FIG. 19 illustrates the second sacrificial layer 2003 positioned on the uppermost portion of the stack layer structure, the example embodiments are not limited thereto. For example, the active layer 2002 may be on the uppermost portion of the stack layer structure.

Next, a first mask pattern 2103 may be formed on the second sacrificial layer 2003. The first mask pattern 2103 may extend in the first direction X.

The first mask pattern 2103 may be formed of a material including at least one of, for example, a silicon oxide layer, a silicon nitride layer and a silicon oxynitride layer.

Figure 20:
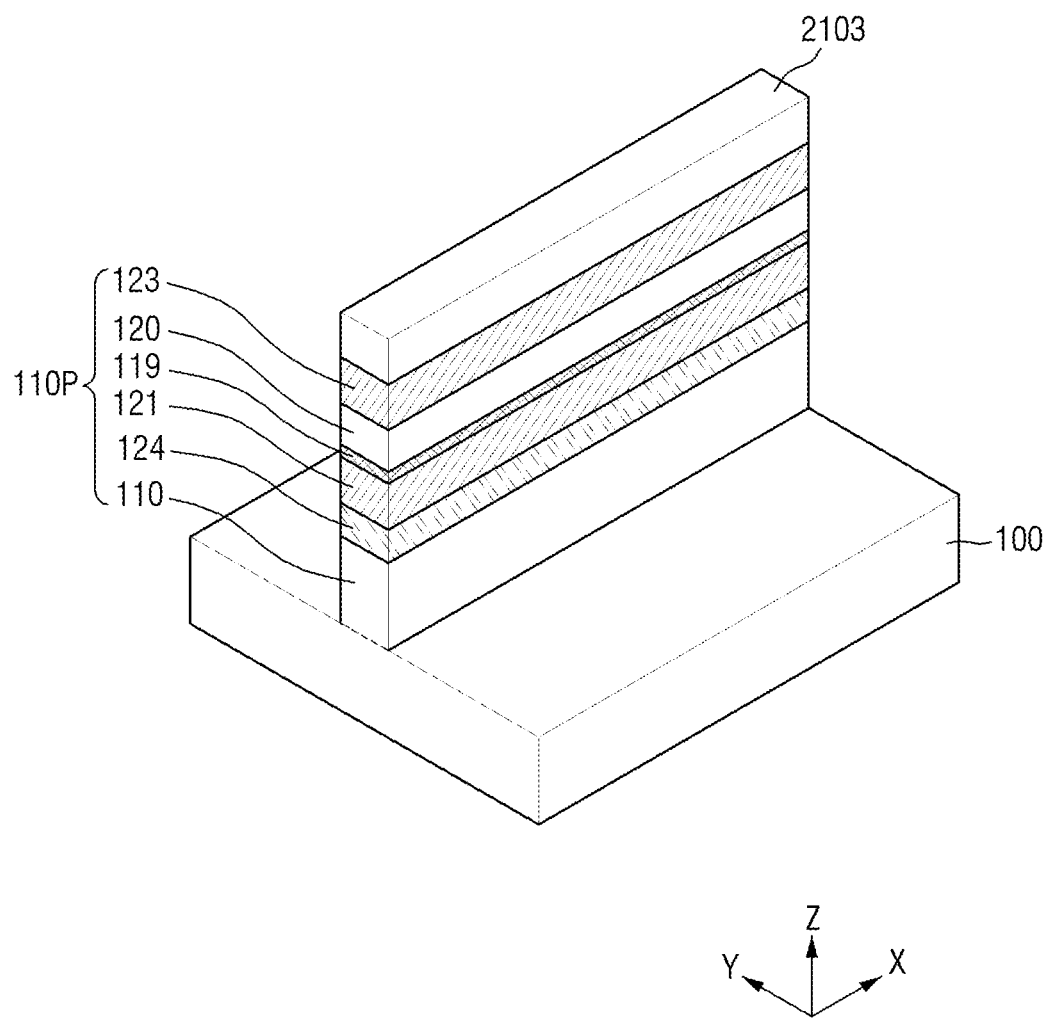

Referring to FIG. 20, an etching process may be performed using the first mask pattern 2103 as an etch mask to form a fin-type structure 110P.

The fin-type structure 110P may be formed by patterning portions of the second sacrificial layer 2003, the active layer 2002, the free passivation layer 2004, the first sacrificial layer 2001, the lower sacrificial layer 2005 and the substrate 100.

The fin-type structure 110P may be formed on the substrate 100, and protruded from the substrate 100. The fin-type structure 110P may extend in the first direction X, like in the case of the first mask pattern 2103.

In the fin-type structure 110P, a fin-type pattern 110, a lower sacrificial pattern 124, a first sacrificial pattern 121, a passivation layer 119, a first nanowire 120 and a second sacrificial pattern 123 may be sequentially stacked on the substrate 100.

Figure 21:
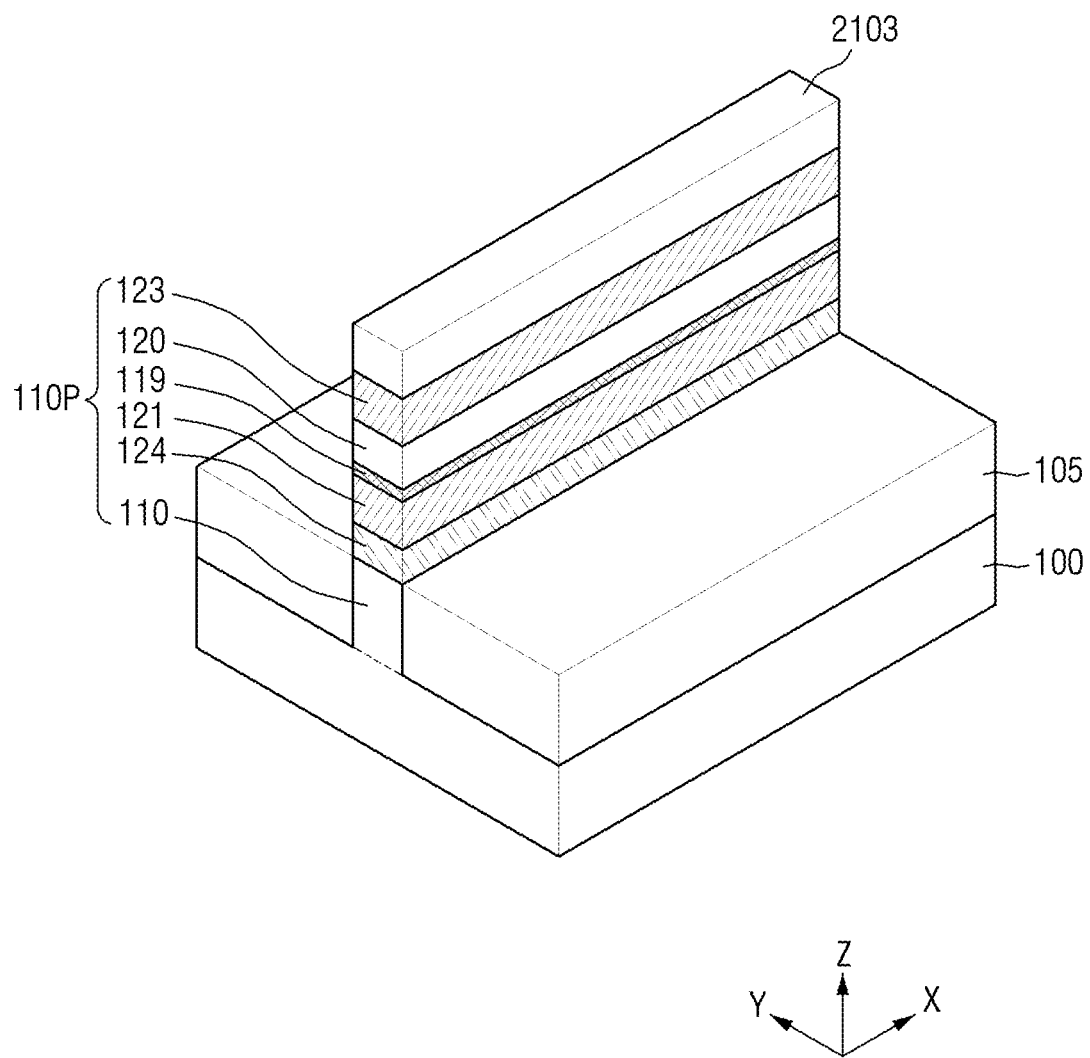

Referring to FIG. 21, a field insulating layer 105 may be formed on the substrate 100 to cover at least a portion of sidewalls of the fin-type structure 110P.

For example, the field insulating layer 105 may be formed on the substrate 100 to cover the fin-type structure 110P. By performing a planarization process for the field insulating layer 105, a top surface of the fin-type structure 110P and a top surface of the field insulating layer 105 may be placed on the same plane.

The first mask pattern 2103 may be removed in the planarization process, but the disclosure is not limited thereto.

An upper portion of the field insulating layer 105 may be then recessed to expose a portion of the fin-type structure 110P. The recess process may include a selective etching process. Accordingly, the fin-type structure may be formed to protrude on the field insulating layer 105.

Referring to FIG. 21, the second sacrificial pattern 123, the first nanowire 120, the passivation layer 119, the first sacrificial pattern 121 and the lower sacrificial pattern 124 may protrude on the top surface of the field insulating layer 105, and the sidewall of the fin-type pattern 110 may be surrounded by the field insulating layer 105. But the disclosure is not limited thereto. For example, a portion of the sidewall of the fin-type pattern 110 may protrude on the top surface of the field insulating layer 105 through the recessing process of the upper portion of the field insulating layer 105.

The first nanowire 120 may be doped with impurities to adjust a threshold voltage of a transistor, before and/or after the recessing process which causes the portion of the fin-type structure 110P to protrude beyond the top surface of the field insulating layer 105. When the semiconductor device is an NMOS transistor, the impurity may be boron (B). When the semiconductor device is a PMOS transistor, the impurity may be phosphorus (P) or arsenic (As). But the disclosure is not limited thereto.

Figure 22:
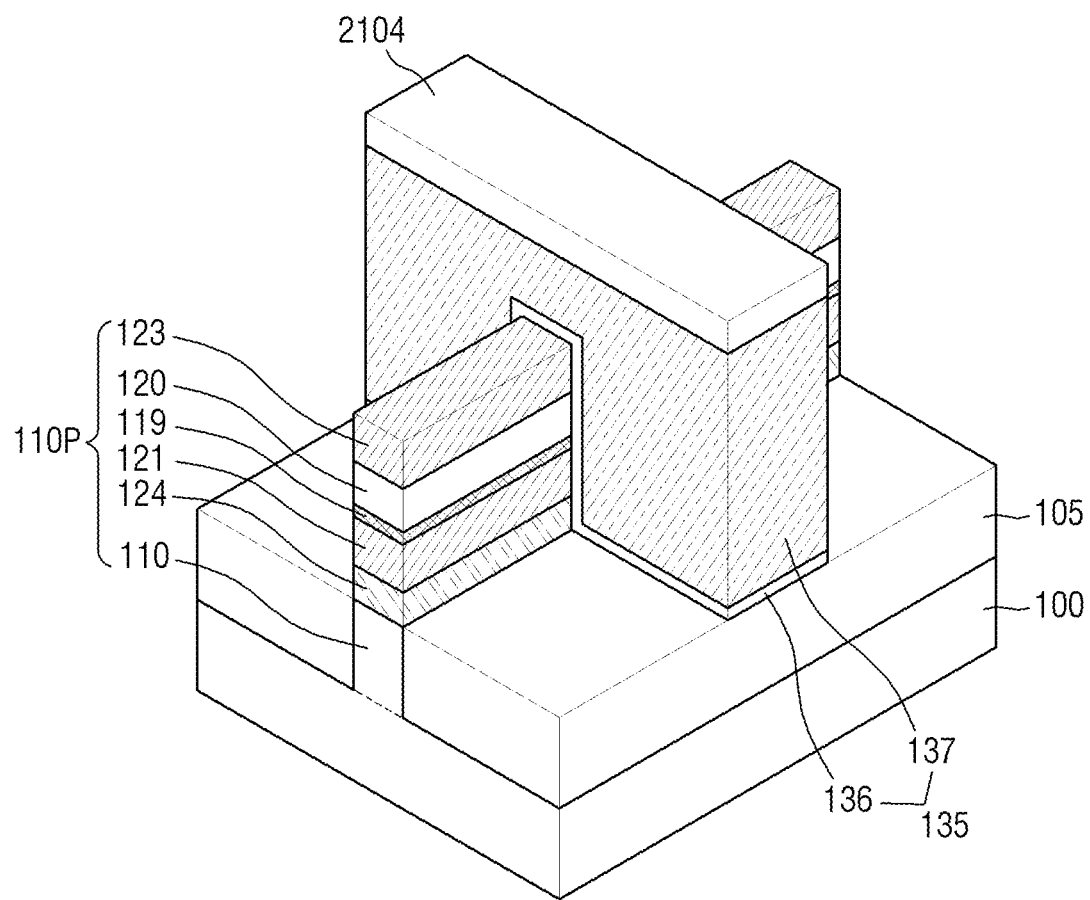

Referring to FIG. 22, a dummy gate pattern 135 may be formed by performing the etching process using a second mask pattern 2104 as an etch mask. The dummy gate pattern 135 may cross the fin-type structure 110P, and extend in the second direction Y. The dummy gate pattern 135 may be formed on the fin-type structure 110P.

The dummy gate pattern 135 may include a dummy gate insulating layer 136 and a dummy gate electrode 137. For example, the dummy gate insulating layer 136 may include a silicon oxide layer, and the dummy gate electrode 137 may include polysilicon or amorphous silicon.

Figure 23:
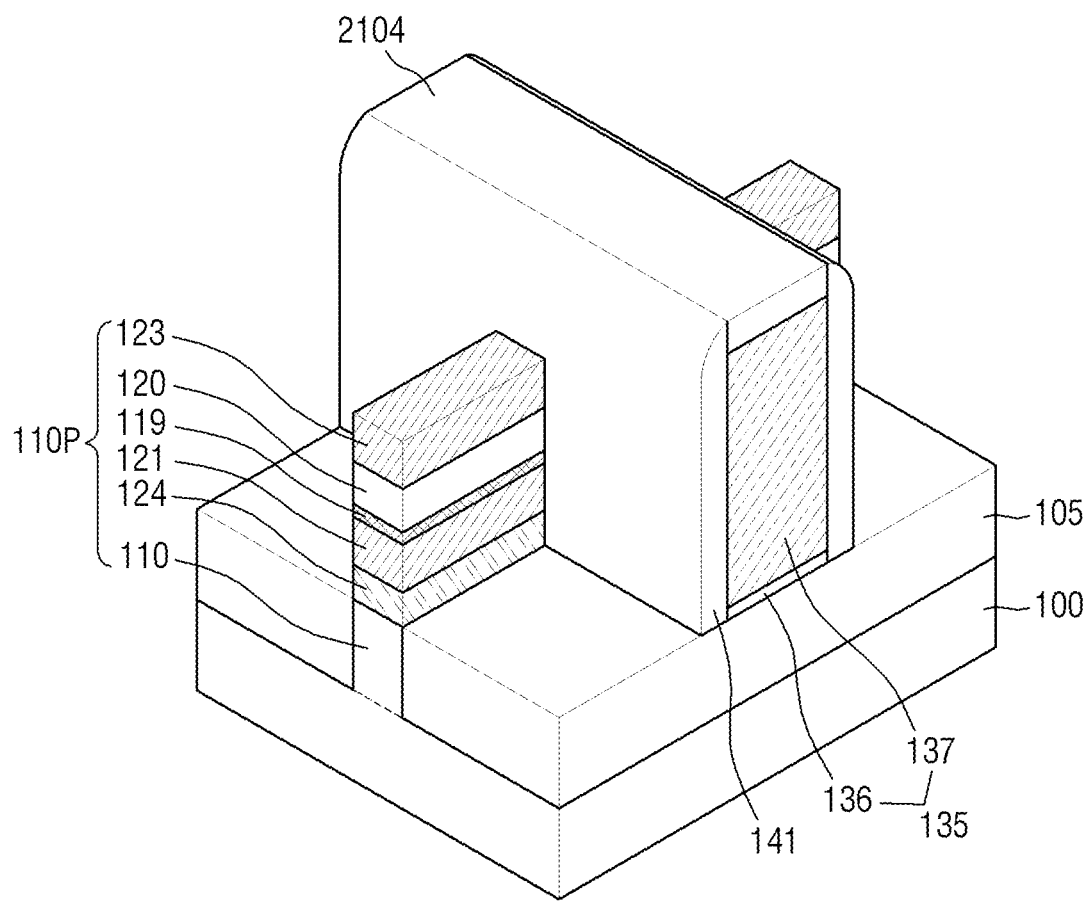

Referring to FIG. 23, an outer spacer 141 may be formed on the sidewalls of the dummy gate insulating layer 136 and the dummy gate electrode 137.

For example, a first spacer layer may be formed on the field insulating layer 105 to cover the dummy gate pattern 135 and the fin-type structure 110P. The first spacer layer may be then etched-back to form the outer spacer 141 on the sidewalls of the dummy gate insulating layer 136 and the dummy gate electrode 137.

Figure 24:
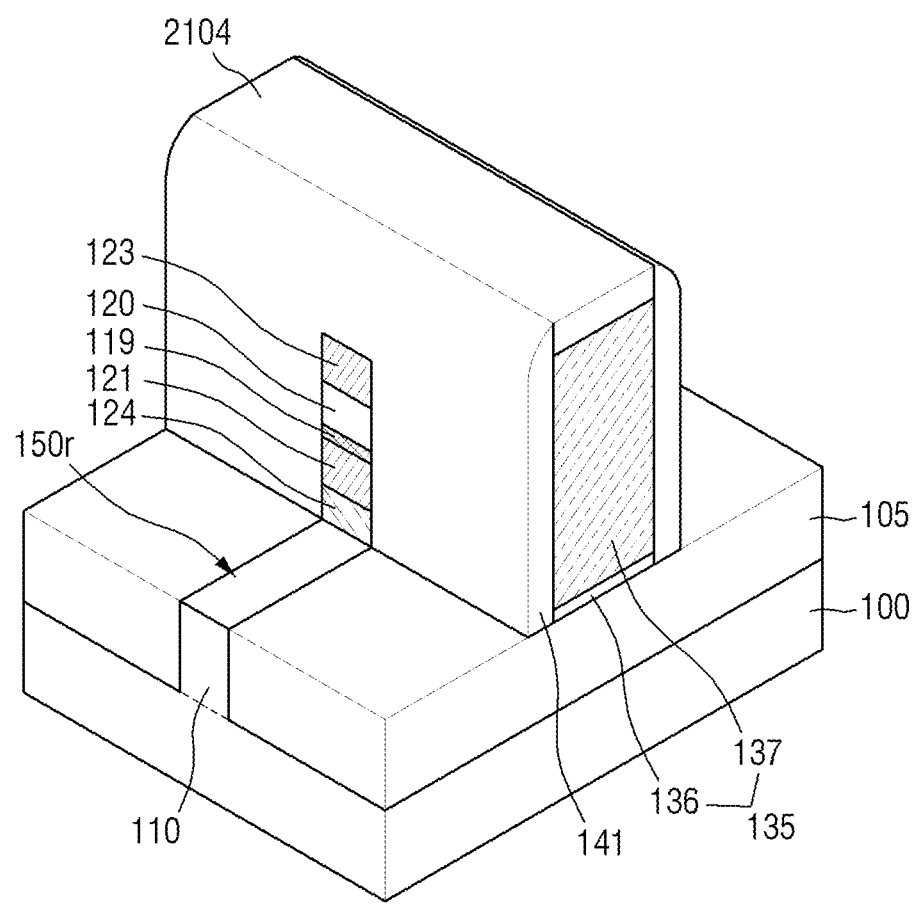

Referring to FIG. 24, a portion of the fin-type structure 110P, which is not overlapped with the dummy gate electrode 137 and the outer spacer 141, may be removed using an etching process. In the etching process, the dummy gate pattern 135 may serve as an etch mask. By doing so, a recess 150r may be formed within the fin-type structure 110P. A bottom surface of the recess 150r may be the top surface of the fin-type pattern 110.

Forming the outer spacer 141 and forming the recess 150r may be concurrently performed, but the disclosure is not limited thereto. For example, the recess 150r may be formed by removing a portion of the fin-type structure 110P, after forming the outer spacer 141.

By the presence of the recess 150r, a cross section of the lower sacrificial pattern 124, a cross section of the first sacrificial pattern 121, a cross section of the passivation layer 119, a cross section of the second sacrificial pattern 123 and a cross section of the first nanowire 120 may be exposed.

Figure 25:
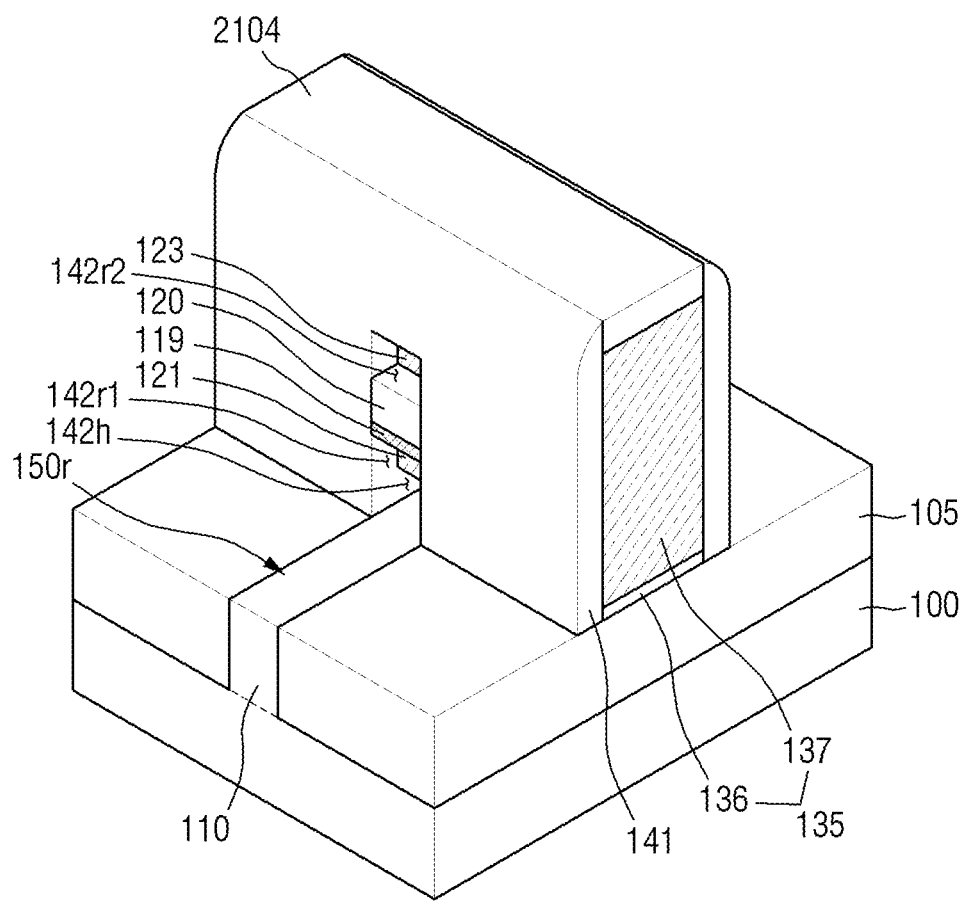

Referring to FIG. 25, the entirety of the lower sacrificial pattern 124, at least a part of the first sacrificial layer 121 and at least a part of the second sacrificial pattern 123, which are exposed by the recess 150r, may be removed. Accordingly, a lower through hole 142h may be formed between the outer spacers 141 and pass through the dummy gate pattern 135.

Furthermore, a first dimple 142r1 may be formed in at least a portion of the first sacrificial pattern 121 which is exposed by the recess 150r and overlapped with the outer spacer 141. A second dimple 142r2 may be formed in at least a portion of the second sacrificial pattern 123 which is exposed by the recess 150r and overlapped between the outer spacer 141 and the first nanowire 120.

The first and second dimples 142r1 and 142r2 may be in the form of a concave recess, and be more recessed in the first direction X than the end surface of the first nanowire 120.

For example, the dimples 142r1 and 142r2 may be formed by using a selective etching process. More specifically, the dimples 142r1 and 142r2 may be formed by the etching process using an etchant with etch selectivity of the first sacrificial pattern 121 and the second sacrificial pattern 123 with respect to the first nanowire 120.

For example, the lower through hole 142h may be formed by using a selective etching process. More specifically, the lower through hole 142h may be formed by the etching process using an etchant with etch selectivity of the first nanowire 120, the first sacrificial pattern 121 and the second sacrificial pattern 123 with respect to the lower sacrificial pattern 124.

Figure 26:
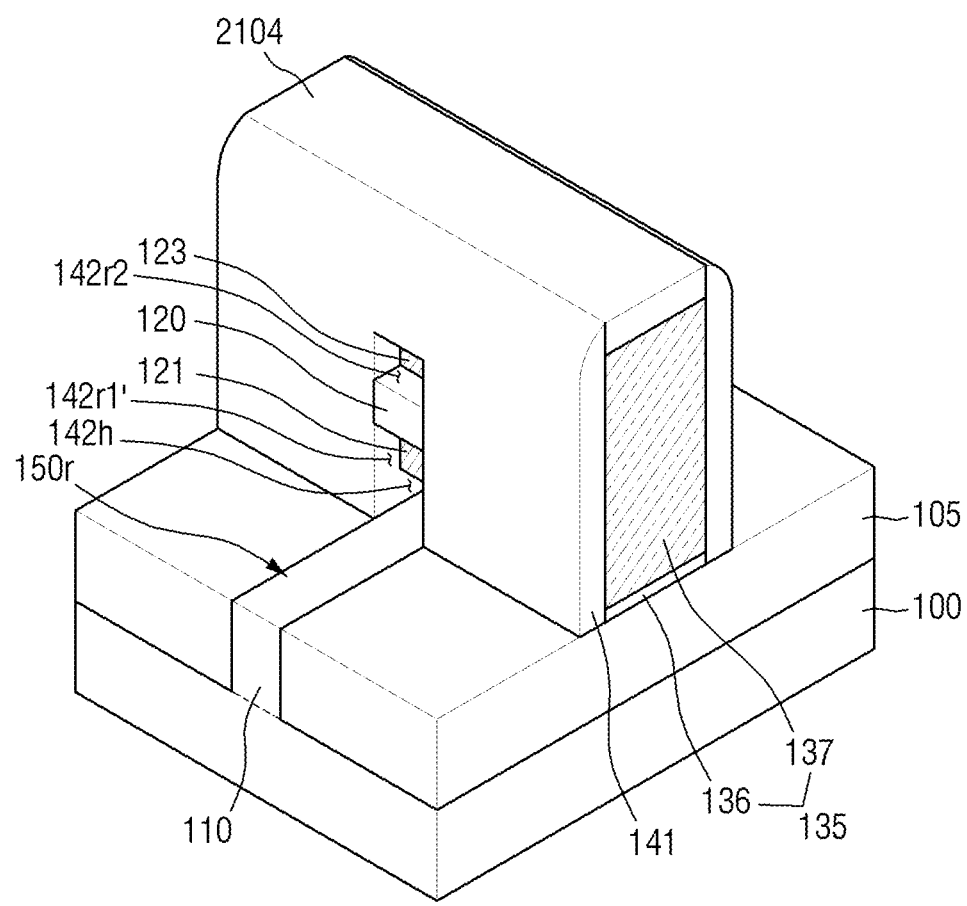

Referring to FIG. 26, a portion of the passivation layer 119 may be removed. The portion of the passivation layer 119, which is not covered with the first sacrificial pattern 121, may be only removed. For example, the portion of the passivation layer 119 exposed by the first dimple 142r1 may be removed. Accordingly, the first dimple 142r1 may be extended to a third dimple 142r1'.

In some embodiments, the passivation layer 119 may be not removed. By doing so, the semiconductor device shown in FIGS. 16 to 18 may be fabricated.

Figure 27:
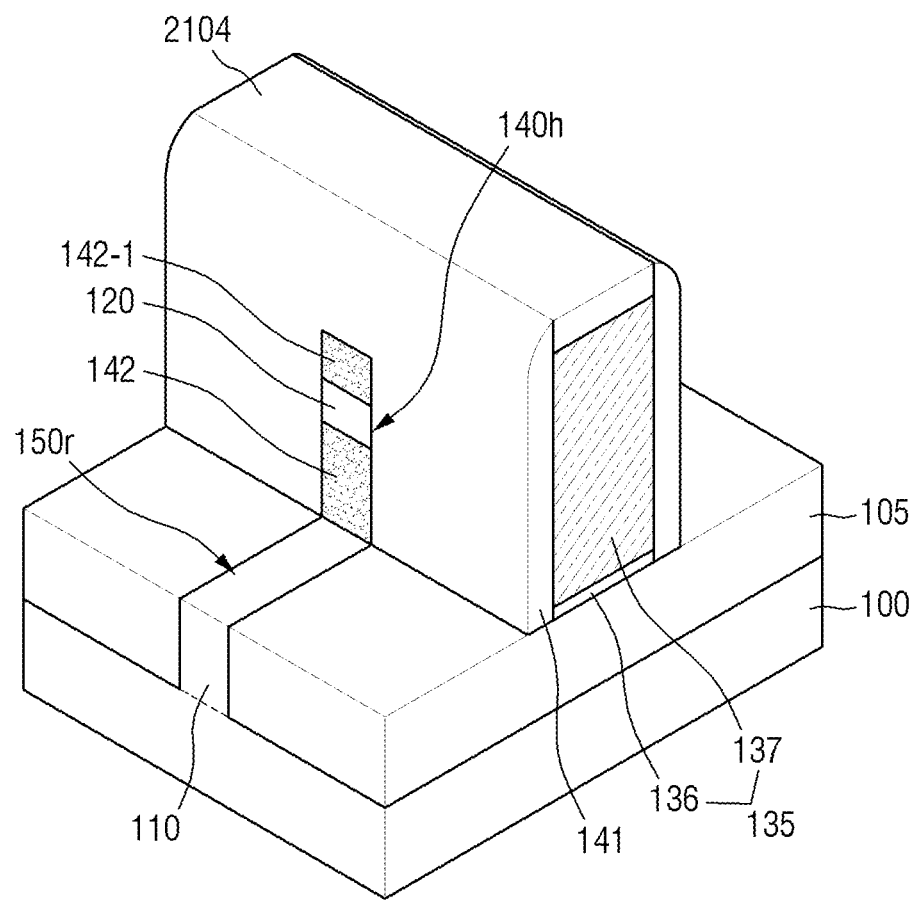

Referring to FIG. 27, the third dimple 142r1' may be filled with an insulating material to form the lower inner spacer 142, and the second dimple 142r2 may be filled with the insulating material to form the first upper inner spacer 142-1.

For example, a second spacer layer filling the dimples 142r1' and 142r2 may be formed on the substrate 100. The second spacer layer may be a material with a good gap-filling capability. The second spacer layer may also be formed on the field insulating layer 105, the sidewall of the outer spacer 141 and the dummy gate pattern 135.

An etching process may then be performed to etch the second spacer layer until the top surface of the fin-type pattern 110, which is not overlapped with the dummy gate pattern 135 and the outer spacer 141, is exposed. As a result, the lower inner spacer 142 and the first upper inner spacer 142-1 may be formed.

Accordingly, the gate spacer 140 including the outer spacer 141, the lower inner spacer 142 and the first upper inner spacer 142-1 may be formed.

Furthermore, the through hole 140h may be defined by the outer spacer 141, the lower inner spacer 142 and the first upper inner spacer 142-1. The first nanowire 120 may be exposed by the through hole 140h. For example, the first nanowire 120 may pass through the through hole 140h.

Figure 28:
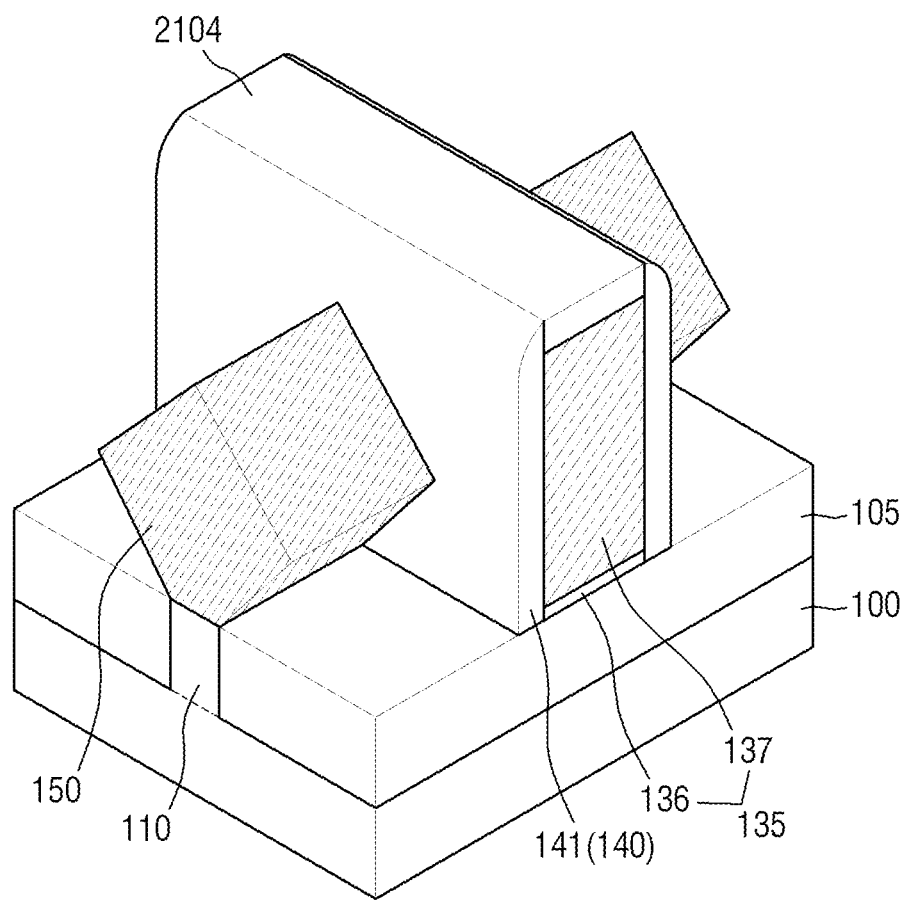

Referring to FIG. 28, a source/drain 150 for filling the recess 150r may be formed on the substrate 100. The source/drain 150 may be formed on both sides of the dummy gate pattern 135.

The source/drain 150 may be formed using the exposed fin-type pattern 110 and the first nanowire 120 as a seed layer.

The source/drain 150 may be formed to cover the lower inner spacer 142. The source/drain 150 may be in contact with the lower inner spacer 142.

The source/drain 150 may be formed by an epitaxial process. Depending on whether a semiconductor device according to example embodiment is an n-type transistor or a p-type transistor, impurities doped in the epitaxial layer of the source/drain 150 may vary. Impurities may be doped in situ during epitaxial process.

Figure 29:
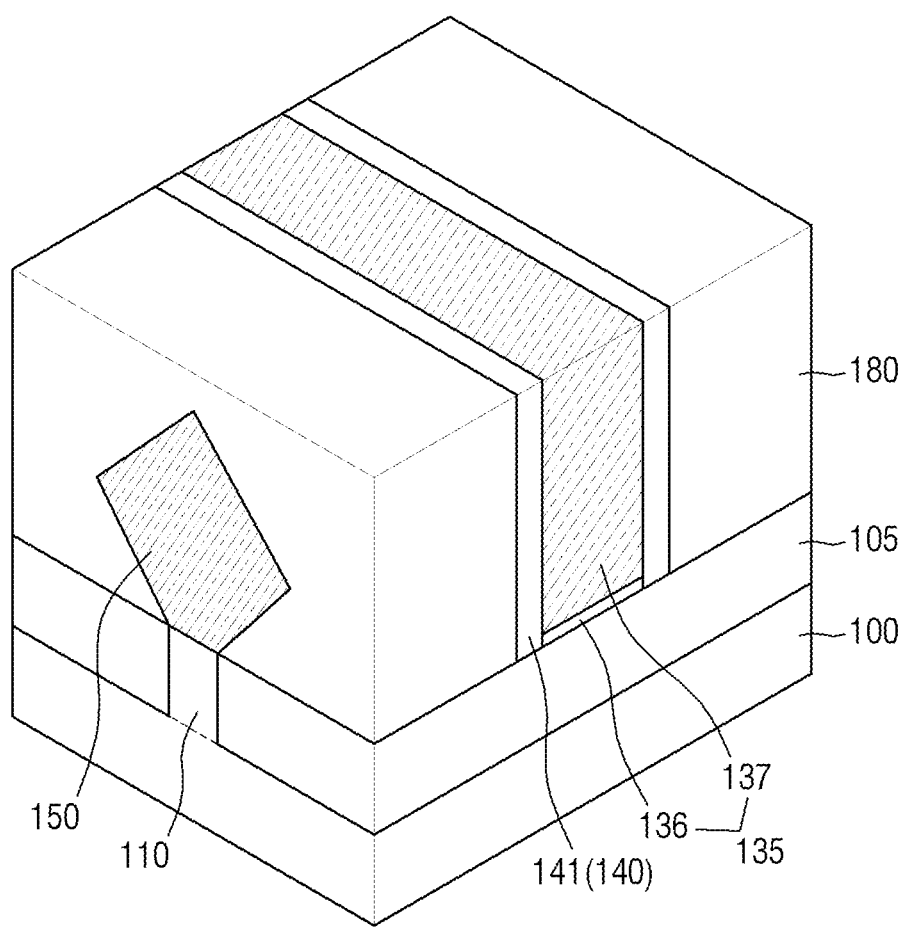

Referring to FIG. 29, an interlayer insulating layer 180 may be formed on the field insulating layer 105 to cover the source/drain 150, the gate spacer 140, the dummy gate pattern 135, and so on.

The interlayer insulating layer 180 may include at least one of low-k dielectric material, oxide, nitride and oxynitride. For example, the low-k dielectric material may be flowable oxide (FOX), Tonen SilaZen (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), high density plasma (HDP) oxide, plasma enhanced oxide (PEOX), flowable CVD (FCVD) oxide, or a combination thereof.

The interlayer insulating layer 180 may be then planarized until the top surface of the dummy gate electrode 137 is exposed. As a result, the second mask pattern 2104 may be removed to expose the top surface of the dummy gate electrode 137.

Figure 30:
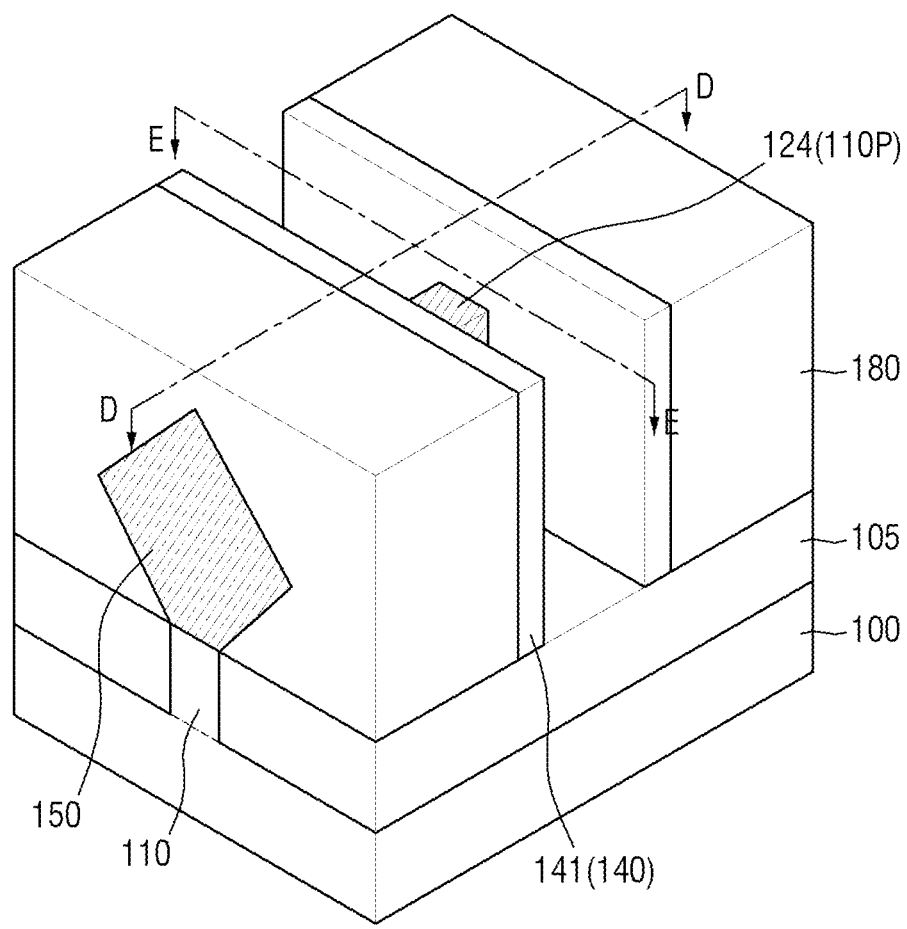
Figure 31:
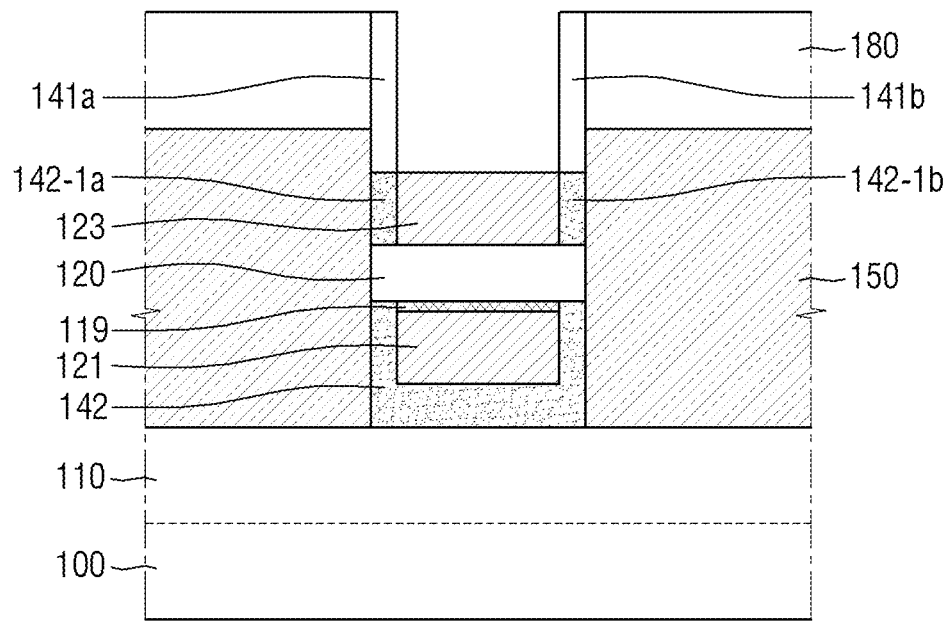
Figure 32:
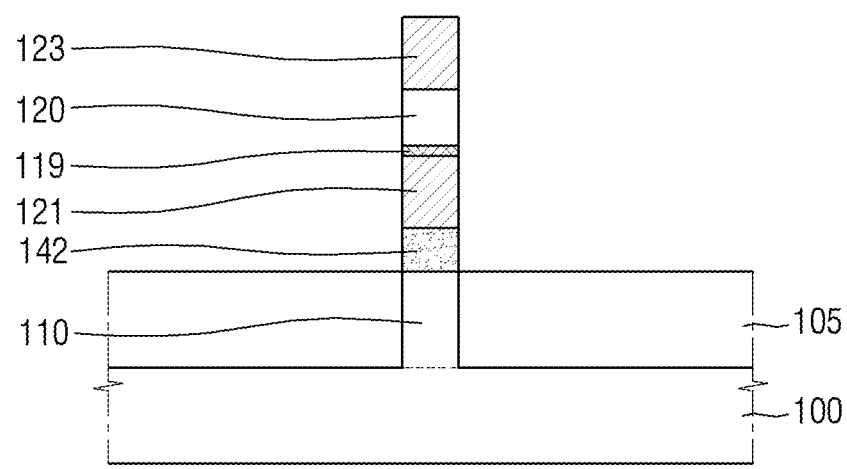

Referring to FIGS. 30 to 32, the dummy gate pattern 135, i.e., the dummy gate insulating layer 136 and the dummy gate electrode 137, may be removed.

By removing the dummy gate insulating layer 136 and the dummy gate electrode 137, the field insulating layer 105 and the fin-type structure 110P overlapped with the dummy gate pattern 135 may be exposed. For example, the first sacrificial pattern 121, the second sacrificial pattern 123, the passivation layer 119 and the first nanowire 120 may be exposed.

Referring to FIGS. 33 and 34, the first sacrificial pattern 121 and the second sacrificial pattern 123 may be removed from the fin-type structure 110P. As a result, a space may be formed between the passivation layer 119 and the lower inner spacer 142, and the first nanowire 120 may be exposed over the fin-type pattern 110.

Removing the first sacrificial pattern 121 and the second sacrificial pattern 123 over and under the first nanowire 120 may be performed by, for example, an etching process. For example, etch selectivity of the first sacrificial pattern 121 and the second sacrificial pattern 123 with respect to the first nanowire 120 may be utilized.

Additionally, the removal of the first sacrificial pattern 121 and the second sacrificial pattern 123 may allow the protruding portions 142a and 142b of the lower inner spacer 142 to be exposed.

Referring to FIGS. 35 and 36, the passivation layer 119 may be removed. Accordingly, the lower surface of the first nanowire 120 may be exposed.

Referring back to FIG. 7, an interface layer 146 may be formed on a periphery of the first nanowire 120 and the top surface of the fin-type pattern 110.

The high-k insulating layer 145 may then be formed on the sidewall of the gate spacer 140, i.e., on sidewalls of the outer spacer 141, the lower inner spacer 142 and the first upper inner spacer 142-1, and along the periphery of the first nanowire 120. Accordingly, the gate insulating layer 147 including the interface layer 146 and the high-k insulating layer 145 may be formed.

Next, the gate electrode 130 surrounding the first nanowire 120 and extending in the second direction Y may be formed. The gate electrode 130 may be a replacement metal gate electrode.

Figure 37:
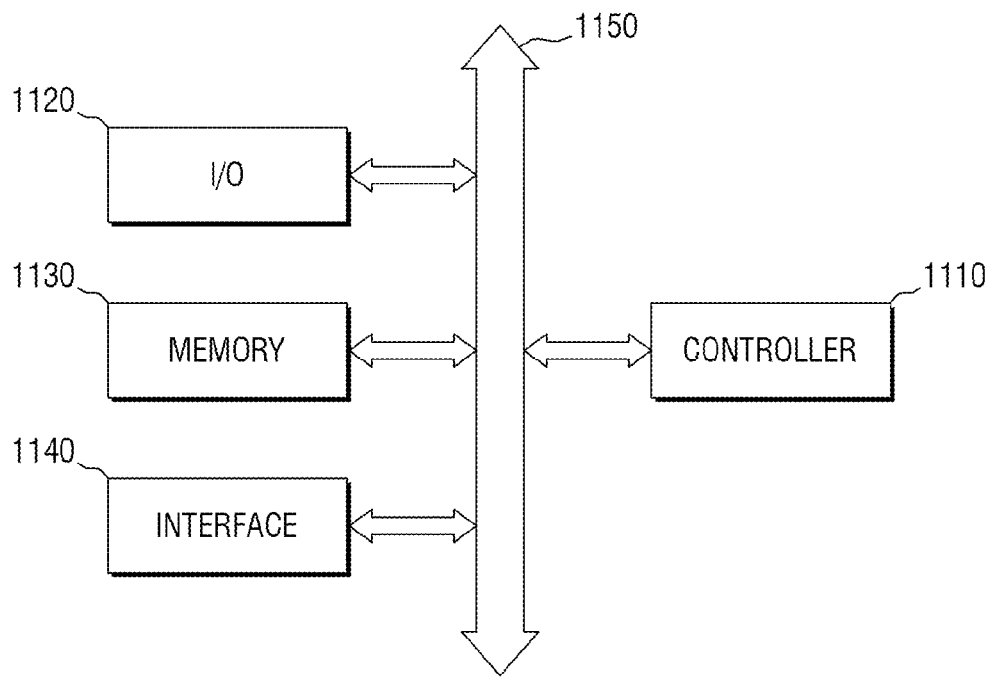
FIG. 37 is a block diagram of an electronic system comprising a semiconductor device according to some example embodiments of the inventive concept.

FIG. 37 is a block diagram of an electronic system comprising a semiconductor device according to some example embodiments of the inventive concept.

Referring to FIG. 37, an electronic system 1100 according to an example embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of a microprocessor, a digital signal processor, a micro controller and a logic device capable of performing functions similar to those mentioned above. The I/O device 1120 may include a keypad, a keyboard, or a display device. The memory device 1130 may store data and/or commands. The interface 1140 may perform a function of transmitting data to communication networks or receiving data from the communication networks. The interface 1140 may be wired or wireless. For example, the interface 1140 may include an antenna or a wired/wireless transceiver. Although not illustrated, the electronic system 1100 may additionally include an operation memory configured to enhance operation of the controller 1110, such as a high-speed dynamic random access memory (DRAM) and/or a static random access memory (SRAM). According to an example embodiment, a semiconductor device fabricated according to an example embodiment may be provided within the memory device 1130, or provided as a part of the controller 1110, or the I/O device 1120.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

Figure 38:
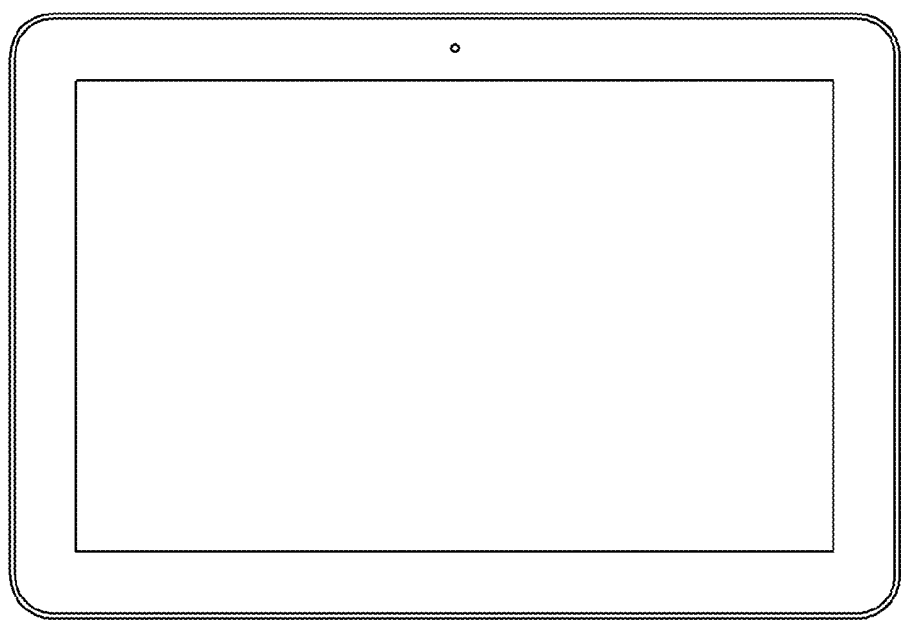
FIGS. 38 and 39 illustrate exemplary semiconductor system including a semiconductor device according to an example embodiment.
Figure 39:
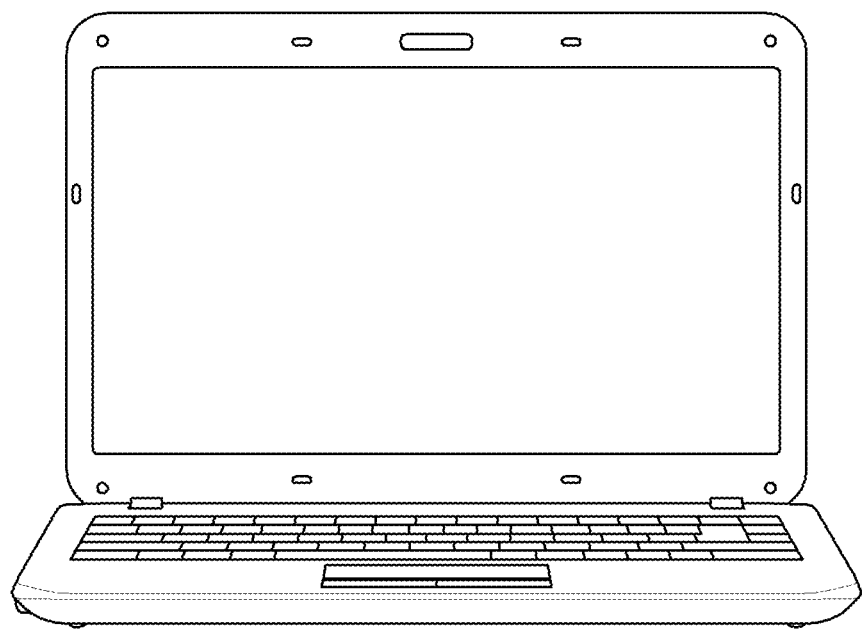

FIGS. 38 and 39 illustrate exemplary semiconductor system including a semiconductor device according to an example embodiment. FIG. 38 illustrates a tablet PC and FIG. 39 illustrates a laptop computer. A semiconductor device according to an example embodiment may be used in the tablet PC or the laptop computer. A semiconductor device according to an example embodiment may be applicable to an integrated circuit device not illustrated herein.

While some embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising: a substrate; a first nanowire extended in a first direction and spaced apart from the substrate; a gate electrode surrounding a periphery of the first nanowire, extending in a second direction intersecting the first direction, and comprising first and second sidewalls opposite to each other; a first gate spacer formed on the first sidewall of the gate electrode, wherein the first nanowire passes through the first gate spacer; a second gate spacer formed on the second sidewall of the gate electrode, wherein the first nanowire passes through the second gate spacer; a source/drain disposed on at least one side of the gate electrode and connected with the first nanowire; and a third gate spacer comprising a spacer connector disposed between the first nanowire and the substrate, wherein the spacer connector connects the first gate spacer and the second gate spacer to each other.

2. The semiconductor device of claim 1, wherein the first gate spacer comprises a first outer spacer contacting top and side surfaces of the first nanowire, and a first inner spacer contacting a lower surface of the first nanowire, wherein the second gate spacer comprises a second outer spacer contacting the top and side surfaces of the first nanowire and a second inner spacer contacting the lower surface of the first nanowire, wherein the first outer spacer and the first inner spacer comprise different materials from each other, and wherein the second outer spacer and the second inner spacer comprise different materials from each other.

3. The semiconductor device of claim 2, wherein the first and second inner spacers comprise the same material as each other.

4. The semiconductor device of claim 2, wherein the first and second outer spacers are spaced apart from each other, wherein the first and second inner spacers are connected to each other through the spacer connector.

5. The semiconductor device of claim 4, wherein the spacer connector and the first and second inner spacers are a single integrated structure.

6. The semiconductor device of claim 1, further comprising a second nanowire disposed on the first nanowire and extended in the first direction, wherein the first nanowire and the second nanowire are spaced apart from each other.

7. The semiconductor device of claim 6, wherein the first gate spacer comprises a first outer spacer contacting top and side surfaces of the second nanowire and a side surface of the first nanowire, a first upper inner spacer contacting a lower surface of the second nanowire and a top surface of the first nanowire, and a first lower inner spacer contacting a lower surface of the first nanowire, and wherein the second gate spacer comprises a second outer spacer contacting the top and side surfaces of the second nanowire and the side surface of the first nanowire, a second upper inner spacer contacting the lower surface of the second nanowire and the top surface of the first nanowire, and a second lower inner spacer contacting the lower surface of the first nanowire.

8. The semiconductor device of claim 7, wherein the first upper inner spacer and the first lower inner spacer comprise the same material as each other, and wherein the second upper inner spacer and the second lower inner spacer comprise the same material as each other.

9. The semiconductor device of claim 7, wherein the first lower inner spacer and the second lower inner spacer are connected to each other through the spacer connector.

10. The semiconductor device of claim 1, wherein the spacer connector comprises an insulating material.

11. A semiconductor device, comprising:

a substrate;

a first nanowire extended in a first direction and spaced apart from the substrate;

a gate electrode surrounding a periphery of the first nanowire and extending in a second direction intersecting the first direction;

a gate spacer disposed on a sidewall of the gate electrode, wherein the gate spacer comprises inner and outer sidewalls opposite to each other, and the inner sidewall of the gate spacer faces the gate electrode;

a source/drain disposed on at least one side of the gate electrode and connected with the first nanowire, wherein the first nanowire passes through the gate spacer to be connected to the source/drain; and an inner spacer comprising a protruding portion disposed between the substrate and the first nanowire and contacting a lower surface of the first nanowire, and a spaced portion connected to the protruding portion and spaced apart from the lower surface of the first nanowire.

12. The semiconductor device of claim 11, wherein the gate electrode comprises first and second side surfaces opposite to each other, and wherein the protruding portion comprises a first protruding portion which is in contact with the first side surface of the gate electrode, and a second protruding portion which is in contact with the second side surface of the gate electrode.

13. The semiconductor device of claim 12, wherein the gate spacer comprises a first gate spacer which is in contact with the first side surface and a second gate spacer which is in contact with the second side surface, wherein a thickness of the first protruding portion is the same as that of the first gate spacer and a thickness of the second protruding portion is the same as that of the second gate spacer.

14. The semiconductor device of claim 11, wherein a length of the inner spacer in the first direction is the same as that of the first nanowire in the first direction.

15. The semiconductor device of claim 11, wherein the gate electrode is disposed between the spaced portion and the first nanowire.

16. A semiconductor device, comprising: a substrate; a first nanowire extended in a first direction and spaced apart from the substrate; a gate electrode surrounding a periphery of the first nanowire and extending in a second direction intersecting the first direction; a gate spacer disposed on a sidewall of the gate electrode, wherein the gate spacer comprises inner and outer sidewalls opposite to each other, and the inner sidewall of the gate spacer faces the gate electrode; a source/drain disposed on at least one side of the gate electrode and connected with the first nanowire, wherein the first nanowire passes through the gate spacer to be connected to the source/drain; and an inner gate spacer disposed between the substrate and the first nanowire, wherein a material included in the gate spacer has a first dielectric constant and a material included in the inner gate spacer has a second dielectric constant different from the first dielectric constant, and wherein a length of the inner gate spacer in the first direction is the same as that of the first nanowire in the first direction.

17. The semiconductor device of claim 16, wherein the second dielectric constant is lower than the first dielectric constant.

18. The semiconductor device of claim 16, further comprising a second nanowire disposed on the first nanowire and extended in the first direction, wherein the first nanowire and the second nanowire are spaced apart from each other in a manner such that a height from an uppermost surface of the substrate to a lowermost surface of the second nanowire is greater than a height from the uppermost surface of the substrate to a lowermost surface of the first nanowire.

19. The semiconductor device of claim 18, further comprising a third nanowire disposed on the second nanowire and extended in the first direction, wherein the second nanowire and the third nanowire are spaced apart from each other in a manner such that a height from the uppermost surface of the substrate to a lowermost surface of the third nanowire is greater than a height from the uppermost surface of the substrate to the lowermost surface of the second nanowire.

* * * * *